(12) United States Patent
Nakauchi

(10) Patent No.: US 7,619,748 B2
(45) Date of Patent: Nov. 17, 2009

(54) EXPOSURE APPARATUS MOUNTED WITH MEASURING APPARATUS

(75) Inventor: Akihiro Nakauchi, Tochigi (JP)

(73) Assignee: Canon Kabushiki Kaisha (JP)

( * ) Notice: Subject to any disclaimer, the term of this patent is extended or adjusted under 35 U.S.C. 154(b) by 183 days.

(21) Appl. No.: 11/067,112

(22) Filed: Feb. 25, 2005

(65) Prior Publication Data

US 2005/0190378 A1    Sep. 1, 2005

(30) Foreign Application Priority Data

Feb. 27, 2004 (JP) ............................ 2004-055358

(51) Int. Cl.
G01B 11/02 (2006.01)
(52) U.S. Cl. ................................... 356/515
(58) Field of Classification Search .................. 356/72, 356/73, 512, 513, 515; 355/53; 359/728
See application file for complete search history.

(56) References Cited

U.S. PATENT DOCUMENTS

| | | | | |
|---|---|---|---|---|
| 4,624,569 A * | 11/1986 | Kwon | ........................... | 356/521 |
| 5,270,771 A * | 12/1993 | Sato | .............................. | 355/53 |
| 5,898,501 A * | 4/1999 | Suzuki et al. | ............... | 356/511 |
| 6,266,147 B1 * | 7/2001 | Naulleau | .................... | 356/515 |
| 6,278,514 B1 * | 8/2001 | Ohsaki | ......................... | 355/55 |
| 6,307,635 B1 * | 10/2001 | Goldberg | ................... | 356/521 |
| 6,312,373 B1 * | 11/2001 | Ichihara | ...................... | 356/515 |
| 6,573,997 B1 * | 6/2003 | Goldberg et al. | ............ | 356/521 |
| 6,614,513 B2 | 9/2003 | Hoyer | | |
| 6,633,362 B2 | 10/2003 | Murakami et al. | | |
| 6,774,982 B2 * | 8/2004 | Ouchi | .......................... | 355/67 |
| 6,914,665 B2 * | 7/2005 | Ishikawa | ..................... | 355/53 |
| 6,937,345 B2 * | 8/2005 | Kuramoto | ................... | 356/515 |
| 7,095,510 B2 * | 8/2006 | Fukui | .......................... | 356/521 |
| 2002/1004138 * | 4/2002 | Kwan | .......................... | 356/616 |
| 2002/0145717 A1 * | 10/2002 | Baselmans et al. | ............ | 355/55 |
| 2002/0159048 A1 | 10/2002 | Inoue et al. | | |
| 2002/0163648 A1 * | 11/2002 | Degertekin et al. | ......... | 356/499 |

(Continued)

FOREIGN PATENT DOCUMENTS

EP    1 387 220 A2    4/2004

(Continued)

OTHER PUBLICATIONS

Communication pursuant to Article 96(2) EPC, dated Mar. 29, 2006.

(Continued)

*Primary Examiner*—Tarifur Chowdhury
*Assistant Examiner*—Jonathan M Hansen
(74) *Attorney, Agent, or Firm*—Rossi, Kimms & McDowell LLP

(57) ABSTRACT

An exposure apparatus for exposing a pattern of a mask onto an object using light from a light source, includes a projection optical system for projecting the pattern onto the object, and a measuring apparatus for measuring, as an interference fringe, optical performance of the projection optical system using the light, wherein the measuring apparatus is a point diffraction interferometer that has a pinhole to form an ideal spherical wave, a line diffraction interferometer that has a slit to form an ideal cylindrical wave or an ideal elliptical wave, or a shearing interferometer that utilizes a shearing interferometry.

1 Claim, 19 Drawing Sheets

U.S. PATENT DOCUMENTS

| | | | |
|---|---|---|---|
| 2004/0090606 A1 | 5/2004 | Ishikawa | |
| 2006/0250607 A1* | 11/2006 | Takahashi | 356/124 |

FOREIGN PATENT DOCUMENTS

| | | |
|---|---|---|
| EP | 1 536 289 A2 | 1/2005 |
| JP | 57-064139 | 4/1982 |
| JP | 2000-097666 | 4/2000 |
| JP | 2000-146705 | 5/2000 |
| JP | 2002-022608 | 1/2002 |
| KR | 10-2004-0007444 | 1/2004 |
| WO | 03/087945 A2 | 10/2003 |

OTHER PUBLICATIONS

Medecki, H. et al: "Phase-Shifting Point Diffraction Interferometer", Optics Letters, Optical Society of America, Washington, US, vol. 21, No. 29, Oct. 1996, pp. 1526-1528.

Communication from European Patent Office, dated Jun. 29, 2005 forwarding European Search Report dated Jun. 21, 2005.

Office Action issued by Korean Patent Office for Korean counterpart application with English translation, dated Jul. 28, 2006.

* cited by examiner

EXPOSURE APPARATUS MOUNTED WITH MEASURING APPARATUS

BACKGROUND OF THE INVENTION

The present invention relates generally to a method and apparatus for measuring performance of an optical element, and more particularly to an exposure apparatus mounted with a measuring apparatus that measures a wave front aberration of a target optical system, such as a projection optical system that transfers a mask pattern onto an object, and an exposure method and device manufacturing method using the measuring apparatus.

A projection exposure apparatus is used to transfer a pattern on a mask (or a reticle) onto an object to be exposed in manufacturing devices, such as semiconductor devices, e.g., an IC and a LSI, image pickup devices, such as a CCD, display devices, such as a liquid crystal panel, and magnetic heads, in the photolithography process. This exposure apparatus is required to transfer the pattern on the reticle onto the object precisely at a predetermined magnification. For this purpose, it is important to use a projection optical system having good imaging performance and reduced aberration. In particular, due to the recent demands for finer processing to the semiconductor devices, a transferred pattern is more sensitive to the aberration of the optical system. Therefore, there is a demand to measure the optical performance, such as a wave front aberration, of the projection optical system with high precision. In addition, the simple, rapid and inexpensive measurements are important for improved productivity and economical efficiency.

A conventional method that actually exposes a mask pattern onto a wafer, and observes and inspects the resist image using a scanning electron microscope ("SEM") or another means has a problem in a long time inspection due to the exposure and development, difficult SEM operations, and bad inspection reproducibility due to errors caused by resist applications and developments. Accordingly, as a solution for these problems, various measuring apparatuses have conventionally been proposed, such as a point diffraction interferometer ("PDI") that has a pinhole used to form an ideal spherical wave, a shearing interferometer, such as a lateral shearing interferometer ("LSI"), or a Talbo interferometer that utilizes the shearing interferometry, and a line diffraction interferometry ("LDI") that has a slit used to form an ideal cylindrical wave or an ideal elliptical wave. See, for example, Japanese Patent Applications, Publication Nos. 57-64139, 2000-146705, and 2000-97666.

However, the conventional measuring apparatuses still enlarge and increase the cost of the entire system that includes the measuring apparatus and exposure apparatus, and cause a long measuring time.

BRIEF SUMMARY OF THE INVENTION

Accordingly, the present invention is directed to an exposure apparatus that is mounted with a measuring apparatus and measures the optical performance (such as a wave front aberration) of a projection optical system with a simple structure and in a short time (or real-time), an exposure method that utilizes the measuring apparatus, and a device manufacturing method using the exposure apparatus.

An exposure apparatus according to one aspect of the present invention for exposing a pattern of a mask onto an object using light from a light source, includes a projection optical system for projecting the pattern onto the object, and a measuring apparatus for measuring, as an interference fringe, optical performance of the projection optical system using the light, wherein the measuring apparatus is a point diffraction interferometer that has a pinhole to form an ideal spherical wave, a line diffraction interferometer that has a slit to form an ideal cylindrical wave or an ideal elliptical wave, or a shearing interferometer that utilizes a shearing interferometry.

An exposure apparatus according to another aspect of the present invention for exposing a pattern of a mask onto an object using light from a light source, includes an illumination optical system for illuminating the mask, an alignment optical system for providing an alignment between the mask and the object, a projection optical system for projecting the pattern onto the object, and a measuring apparatus for measuring, as an interference fringe, optical performance of the projection optical system using the light, wherein at least one of the illumination optical system and the alignment optical system serves as part of the measuring apparatus.

An exposure method according to still another aspect of the present invention includes the steps of calculating optical performance of a projection optical system using the above exposure apparatus, adjusting the projection optical system based on the optical performance of the projection optical system, which is calculated by the calculating step, and exposing an object using the exposure apparatus that includes the projection optical system adjusted by the adjusting step.

A device manufacturing method according to still another aspect of the present invention includes the steps of exposing an object using the above exposure apparatus, and developing the object exposed.

Other objects and further features of the present invention will become readily apparent from the following description of the preferred embodiments with reference to accompanying drawings.

DETAILED DESCRIPTION OF THE PREFERRED EMBODIMENTS

Figure 1:
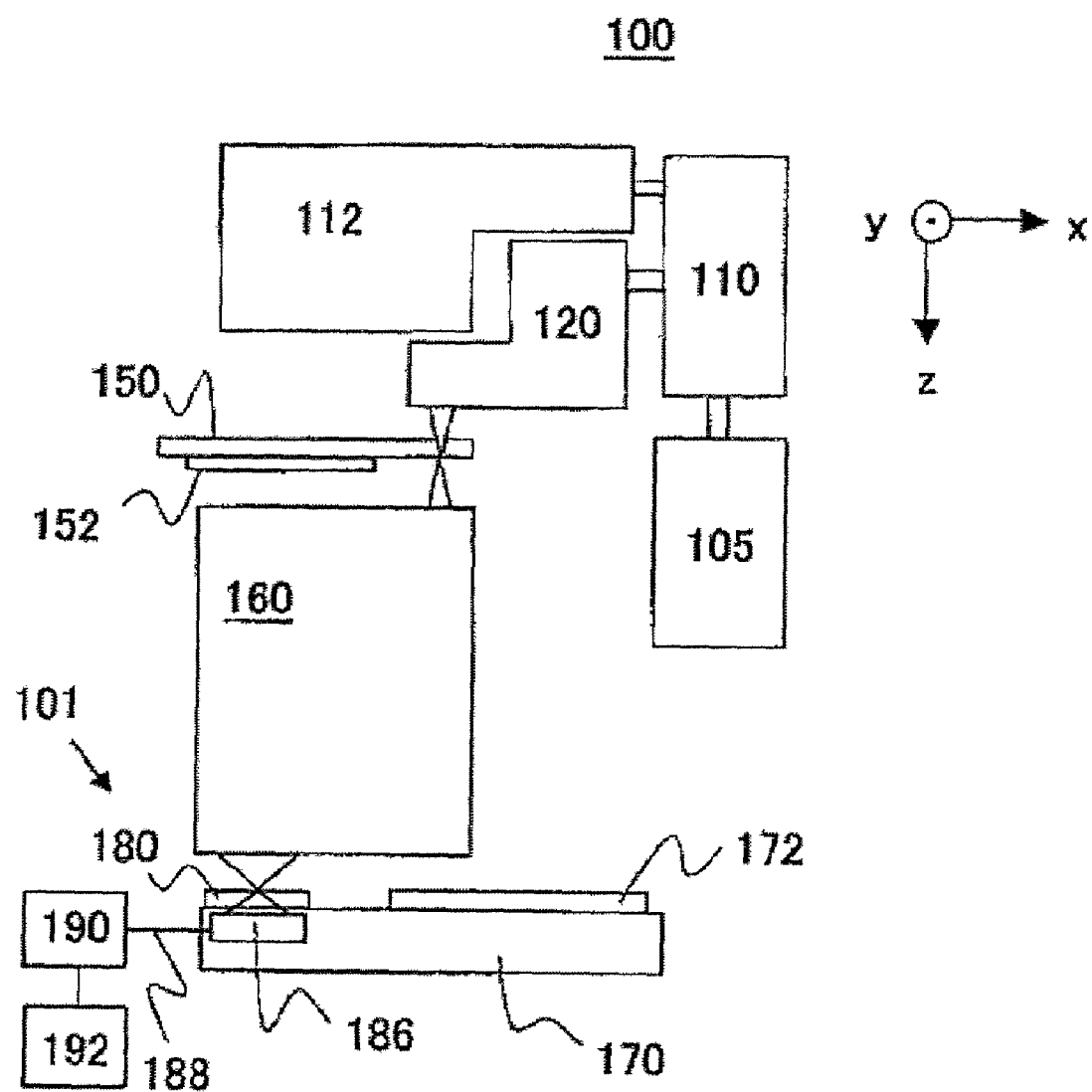
FIG. 1 is a schematic block diagram of an exposure apparatus mounted with a measuring apparatus common to a first to third embodiments of the present invention.

Referring now to the accompanying drawings, a description will be given of an exposure apparatus mounted with a measuring apparatus according to one embodiment of the present invention. Here, FIG. 1 is a schematic structure of an exposure apparatus 100. The exposure apparatus 100 of this embodiment is a projection exposure apparatus to expose a circuit pattern of a mask 152 onto an object (plate) 172, e.g., in a step-and-repeat or a step-and-scan manner. Such an exposure apparatus is suitably applicable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 100 includes a measuring apparatus 101, an illumination apparatus, an alignment optical system 120, a mask 152, a projection optical system 160, and a plate 172. In this specification, a reference numeral 100 generalizes a reference numeral 100A etc. unless otherwise specified.

The illumination apparatus illuminates the mask 152 that has a circuit pattern to be transferred, and therefore, includes a light source section 105 and an illumination optical system (a deflection optical system 110, a first illumination optical system 112). The light source section 105 may use as a light source an ArF excimer laser with a wavelength of approximately 193 nm, and a KrF excimer laser with a wavelength of approximately 248 nm. A kind of laser is not limited to excimer laser, and the number of laser units is not limited. When the light source unit 105 uses a laser, it is desirable to employ a beam shaping optical system that turns a parallel beam from a laser light source into a desired beam shape and an incoherently turning optical system that turns a coherent laser beam into an incoherent one. A light source applicable to the light source unit 105 is not limited to a laser. One or more lamps may be used, such as a mercury lamp and a xenon lamp.

The illumination optical system is an optical system that illuminates the mask 152. It includes a lens, a mirror, a light integrator, a σ stop, and the like. The illumination optical system of this embodiment includes a deflection optical system 110, and a first illumination optical system 112. The deflection optical system 110 deflects the light from the light source section 105, and introduces the light into the first and second illumination optical system 112 and 120. The first illumination optical system 112 is an optical system that illuminates the mask 152, and includes, for example, a condenser lens, a fly-eye lens, an aperture stop, a condenser lens, a slit, and an imaging optical system in this order.

The alignment optical system 120 serves to illuminate the mask used for the measuring apparatus 101, i.e., first and second masks 142 and 180, which will be described later, and is thus sometimes referred to as a second illumination optical system in this specification. The alignment optical system 120 constitutes an alignment scope, and part of the measuring apparatus 101, as described later. The alignment optical system 120 is arranged outside the optical path during the normal exposure, and FIG. 1 omits a driving mechanism that drives the alignment optical system 120. The alignment scope illuminates an alignment mark (not shown) on the mask 152, and compares the reflected light and the reference mark. The alignment scope also provides an alignment of the wafer stage 170 by imaging an alignment mark on the wafer stage 170 onto the projection optical system 160.

The mask 152 is made for example, of quartz, and has a circuit pattern (or an image) to be transferred. It is supported and driven by a mask stage (or a reticle stage) 150. The diffracted light from the mask 152 passes the projection optical system 160, and then is projected onto the plate 172. The mask 152 and the plate 172 are located in an optically conjugate relationship. Since the exposure apparatus 100 of the instant embodiment is a scanner, the mask 152 and the plate 172 are scanned at a speed ratio of the reduction ratio. Thus the pattern of the mask 152 is transferred to the plate 172. If it is a step-and-repeat exposure apparatus (referred to as a "stepper"), the mask 152 and the plate 172 remain still in exposing the mask pattern.

The projection optical system 160 may use a (dioptric) optical system solely including a plurality of lens elements, a (catadioptric) optical system including a plurality of lens elements and at least one mirror, an optical system including a plurality of lens elements and at least one diffraction optical element such as a kinoform, and a (catoptric) optical system of a full mirror type, and so on. Any necessary correction of the chromatic aberrations may use a plurality of lens units made from glass materials having different dispersion values (Abbe values) or can arrange a diffraction optical element such that it disperses in a direction opposite to that of the lens unit. The measuring apparatus 101 measures the optical performance (such as a wave front aberration) of the projection optical system 160.

The plate 172 is an exemplary object to be exposed, such as, a wafer and a LCD. A photoresist is applied to the plate 172. The stage 170 supports the plate 172 and part of the measuring apparatus 101. The stage 170 may use any structures known in the art. A detailed description of its structure and operation is omitted. The stage 170 may use, for example, a linear motor to move the plate 172 in the XY directions. The mask 152 and plate 172 are, for example, scanned synchronously. The positions of the stage 170 and mask stage 150 are monitored, for example, by the second illumination optical system 120, so that both are driven at a constant speed ratio.

The measuring apparatus 101 includes the alignment optical system (or second illumination optical system) 120, a first mask 142, a light splitting means 146, a second mask 180, an image pickup means 186, a communication cable 188, a controller 190, and a memory 192. In this embodiment, the measuring apparatus 101 includes an interferometer that measures the optical performance of the projection optical system as a target optical system by detecting an interference fringe, and the interferometer uses an LDI. However, the measuring apparatus 101 may use a PDI and an LSI, as described later.

Figure 2:
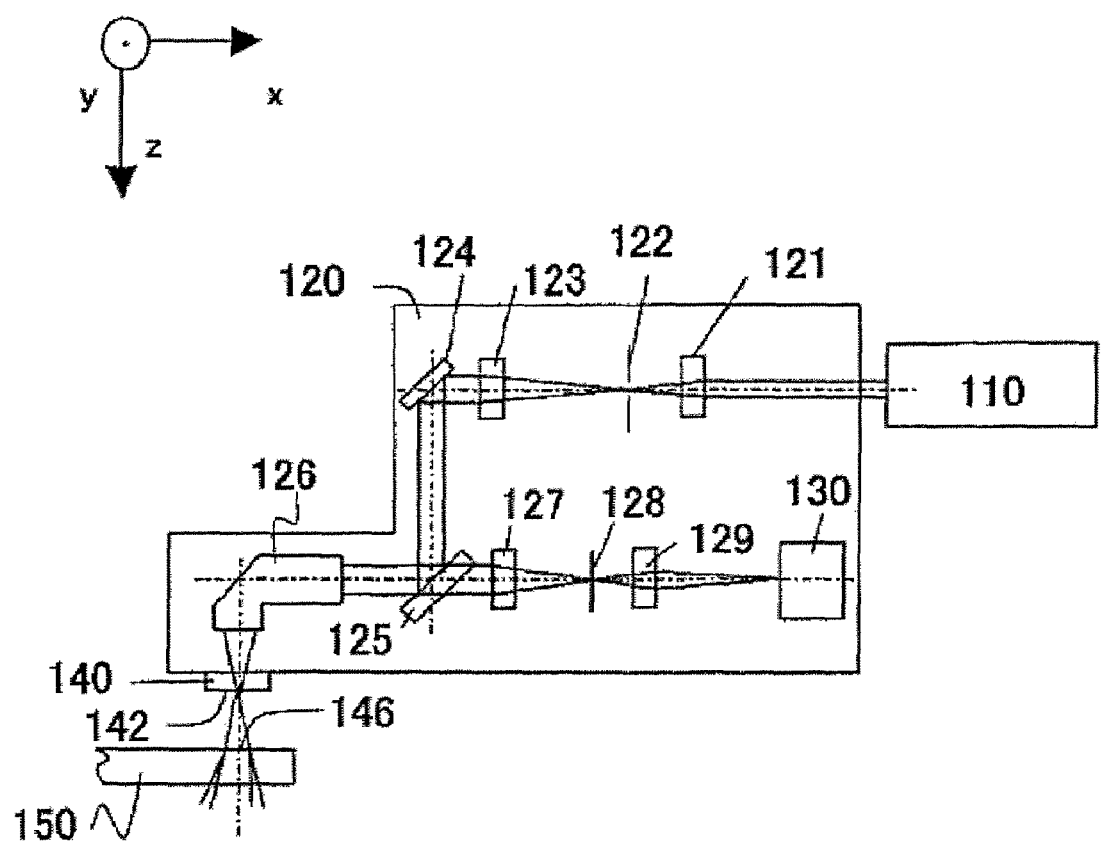
FIG. 2 is an optical-path diagram of a second illumination optical system, a light splitting means and a first mask in the measuring apparatus according to the first embodiment of the present invention, applicable to the exposure apparatus shown in FIG. 1.

As shown in FIG. 2, the second illumination optical system 120 includes illuminating optical systems 121 and 123, a field stop 122 for the illumination optical system, a deflection mirror 124, a half mirror 125, a condenser lens 126, optical system 127 and 129 for an image pickup system, a reference mark 128, and an image pickup means 130. Here, FIG. 2 is an optical-path diagram of the second illumination optical system 120, the first mask 142 and the light splitting means 146 in the measuring apparatus 101.

The optical system 121 is a condenser optical system that condenses the light into the field stop 122, and the optical system is a collimator that turns the light from the field stop 122 into the parallel light. The deflection mirror 124 and the half mirror 125 deflect the light from the optical system 124, and the condenser lens 126 condenses the light into the first mask 142. Since the light supplied form the light source section 105 via the deflection optical system 110 passes the optical elements 121 to 126 to the projection optical system 160, and the optical elements 125 to 130 serve as an alignment scope for the mask stage 150 and the wafer stage 170, the condenser lens 126 serves as an objective lens for all alignments between the mask pattern and the plate 172.

Figure 3:
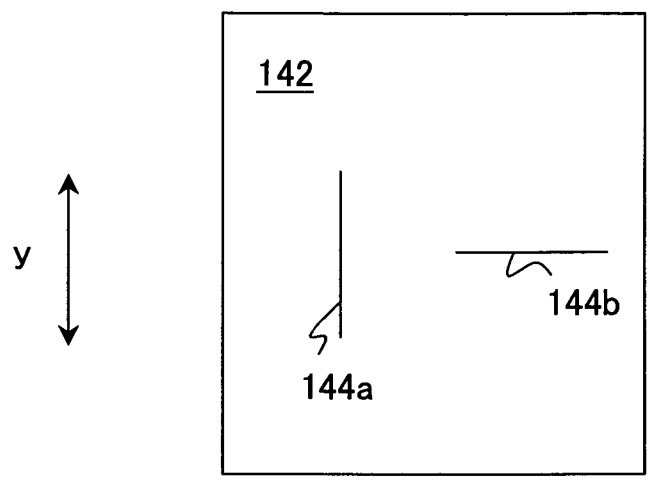
FIG. 3 is a schematic plane view of the first mask shown in FIG. 2.

The first mask 142 is attached to the second illumination optical system 120 via the substrate 140, and includes a pair of slits 144a and 144b as shown in FIG. 3. Here, FIG. 3 is a schematic plane view of the first mask 142. The first mask 142 includes two types of slits 144a and 144b arranged at an angle of 90°. The slits 144a and 144b have the same width and length but different orientations.

As described later, the condenser lens 126 illuminates only the slits 144a or 144b. For this purpose, the first mask 142 may be movably attached to the second illumination optical system 120 via the driving mechanism (not shown), or the driving mechanism may be provided at the second illumination optical system 120.

This embodiment sometimes refers to a direction in which the slit 144a extends as a y direction, and a direction in which the slit 144b extends an x direction. In addition, this embodiment sometimes refers to the slit 144a as a 0° orienting slit, and the slit 144b as a 90° orienting slit. A width Δr of the slits 144a and 144b is smaller than a diffraction limit defined as follows, where NAo is an NA of the projection optical system 160 at the reticle side or an object surface side, and is a wavelength of the exposure light.

$$\Delta r < 0.5 \cdot \lambda / NAo \qquad \text{[EQUATION 1]}$$

The equiphase zone of the light diffracted from the slit is maintained in a range of NAo when the slit width is defined by Equation 1. A greater length Lr improves the light intensity, but should be smaller than the isoplanatic area where the identity of the aberration of the projection optical system 160 can be maintained.

The light splitting means 146 amplitude-splits the light diffracted from the slits 144a and 144b. The light splitting means 146 is implemented by a grating having a structure shown in FIG. 4, for example. The light splitting means 146 is placed on a transparent substrate (not shown) arranged on the mask stage 150. Alternatively, a substrate (not shown) that arranges a diffraction grating is provided and mounted on the mask stage 150 instead of the mask 152.

Figure 4:
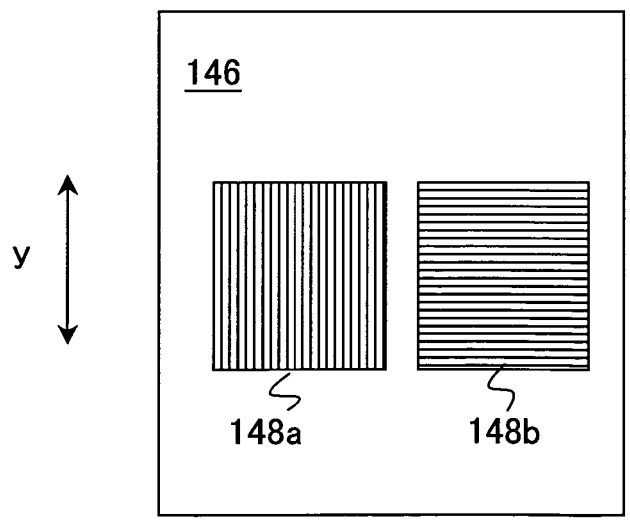
FIG. 4 is a schematic plane view of the light splitting means shown in FIG. 2.

In FIG. 4, the light splitting means 146 is an amplitude type diffraction grating. In using the slit 144 that is long in the y direction, the diffraction grating that arranges lines in the x direction like 148a shown in FIG. 4. The diffraction grating 148a splits the light in the x direction. The projection optical system 160 images the split lights onto the second mask 180. The diffraction gratings 148a and 148b are driven by the driving mechanism of the mask stage 150 on which the light splitting means 146 is placed.

Figure 5:
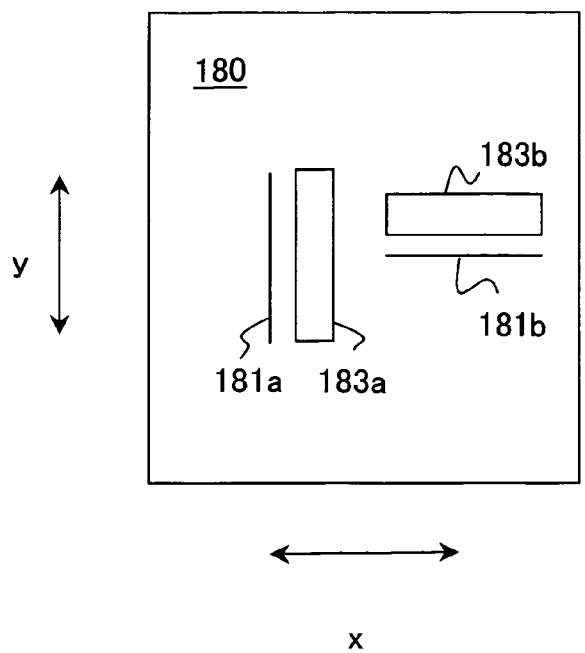
FIG. 5 is a schematic plane view of a second mask shown in FIG. 1.

The second mask 180 includes, as shown in FIG. 5, a pair of a 0° orienting (y direction) slit 181a and a window 183a, and a pair of a 90° orienting (x direction) slit 181b and a window 183b. Here, FIG. 5 is a schematic plane view of the second mask 180. The pair of the slit 181a and window 183a and the pair of the slit 181b and window 183b have the same width and length but different orientations. A width Δw of the slits 181a and 181b is smaller than a diffraction limit defined as follows, where NAi is an NA of the projection optical system 160 at the wafer side or an image surface side, and A is a wavelength of the exposure light.

$$\Delta w < 0.5 \cdot \lambda / NAi \qquad \text{[EQUATION 2]}$$

The equiphase of the light diffracted from the slit can be maintained in a range of NAi when the width of the slits 181a and 181b is defined by Equation 2.

A width Δw' of the windows 183a and 183b is determined by the spatial frequency of the projection optical system to be measured. It is made narrow for low frequency measurements, and made wide for high frequency measurements. Δw' is given by the next equation where f is a spatial frequency of a pupil of the projection optical system 160, and the wave front aberration that has one period at the pupil radius has a frequency f of 1:

$$\Delta w' = 2 \cdot f \cdot \lambda / NAi \qquad \text{[EQUATION 3]}$$

A greater length Lw improves the light intensity, but should be smaller than the isoplanatic area where the identity of the aberration of the projection optical system 160 can be maintained.

The image pickup means 186 is a CCD etc., and detects an interference fringe of two lights from the slit 181a or 181b and the window 183a or 183b. The cable 188 connects the image pickup means 186 and the controller 190 so that they can communicate with each other. The controller 190 obtains phase information from an output from the image pickup means 186. The memory 192 stores a measuring method shown in FIG. 8, which will be described later, a processing method for obtaining the phase information from the output of the image pickup means 186, phase information obtained by the controller 190, a control method conducted by the controller 190 and other data.

Figure 8:
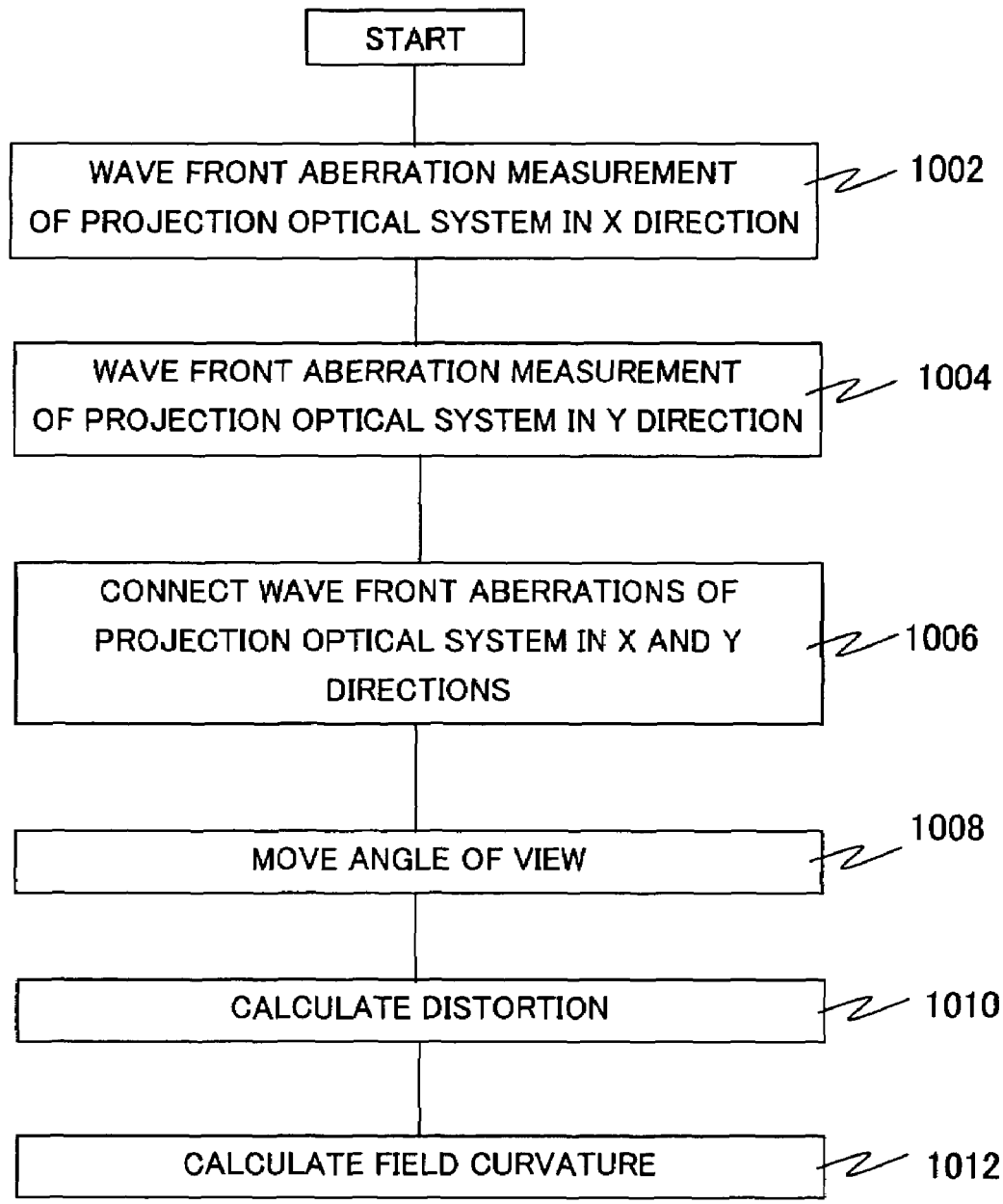
FIG. 8 is a flowchart for explaining an operation of the measuring apparatus shown in FIG. 1.

Referring now to FIG. 8, a description will be given of an operation of the measuring apparatus 101. Here, FIG. 8 is a flowchart for explaining the operation of the measuring apparatus 101. First, the wave front aberration of the projection optical system 160 in the x direction is measured (step 1002).

In FIG. 1, the light emitted from the light source section 105 is deflected to the second illumination optical system 120 for imaging performance measurements by the deflection optical system 110. The light from the deflection optical system 110 is condensed into the optical system 121 for the illumination optical system, and irradiated onto the field stop 122. The field stop 122 has a size enough to irradiate the first mask 142 on the substrate 140. The light from the field stop 122 is collimated by the optical system 123, deflected by the deflection mirror 124 and half mirror 125, and introduced into the condenser lens 126. The condenser lens 126 condenses the light into the first mask 142.

In step 1002, the driving mechanism (not shown) moves the second illumination optical system 120 and the first mask 142 relative to each other so that the light from the condenser lens 126 irradiates only the 0° orienting slit 144a.

Since the slit 144a has a width smaller than the diffraction limit, the light exited from the slit 144a becomes the diffraction light having an equiphase wave front in the x direction. On the other hand, the light diffraction in the y direction or the longitudinal direction of the slit 144a is so small that the condenser lens 126 condenses into the slit 144a the light that has a NA equal to or greater than the NA of the projection optical system 160 at the object side or the reticle side, at least in the y direction in FIG. 3. Thereby, the light can be irradiated onto the entire pupil surface in the projection optical system 160. The light diffracted in the width direction of the slit 144a has an equiphase wave front.

The slit 144a diffracts the light, and the light has an equiphase wave front in the x direction and is amplitude-split by the diffraction grating 148a of the light splitting means 146 in the x direction. Plural amplitude-split lights are imaged on the second mask 180 by the projection optical system 160. In other words, a pitch of the diffraction grating 148a is determined and the light splitting means 146 is positioned by the mask stage 150 so that among the lights that are diffracted by the slit 144a and diffraction grating 148a, the 0th order light images on the slit 181a and the 1st order diffracted light images on the window 183a in the second mask 180. The light-shielding part on the second mask 180 shields other diffracted lights. The −1st order diffracted light may be used instead of the 1st order diffracted light.

Figure 6:
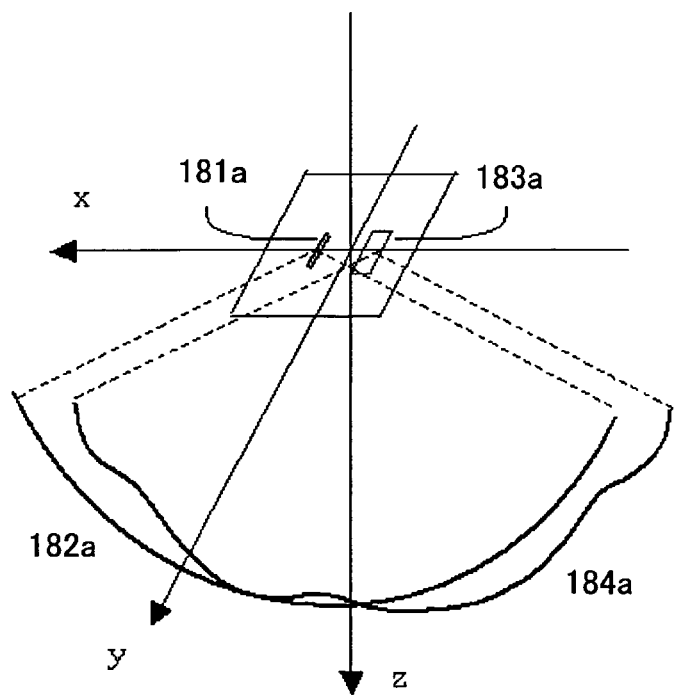
FIG. 6 is a schematic view of the lights exited from a slit and a window in the second mask shown in FIG. 5.

The light that passes the window 183a receives the influence of the wave front aberration of the projection optical system 160. On the other hand, the slit 181a has a width smaller than the diffraction limit, and thus the light exited from the slit 181a spreads in the x direction, as the diffracted light having an equiphase wave front from which the wave front aberration information of the projection optical system 160 is removed in the x direction. FIG. 6 shows the light exited from the slit 181a and the center of the window 183a. Understandably, the light that passes the slit 181a has an ideal cylindrical wave front or ideal elliptical wave front 182a, and the light that passes the window 183a has a target wave front 184a.

Figure 7:
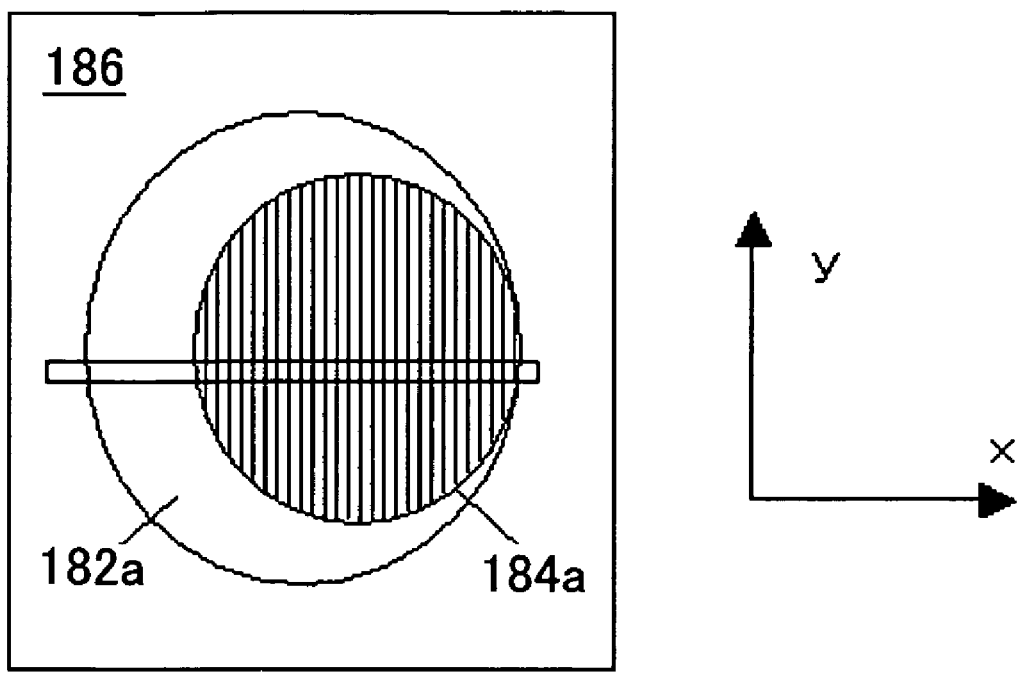
FIG. 7 is a schematic plane view showing one exemplary interference fringe of the lights exited from the slit and window shown in FIG. 5, to be detected by an image pickup means shown in FIG. 2.

FIG. 7 shows an illustrative interference fringe of the light exited from the slit 181a and the center of the window 183a, to be detected by the image pickup means 186. An interference fringe occurs in a common area of two pupil images of the projection optical system 160, which have centers offset by an interval between the slit 181a and the window 183a. Since the light 182a has an equiphase wave front in the x direction, the wave front aberration of the projection optical system 160 in the x direction can be obtained by picking up the phase information from the interference fringe shown in FIG. 7. The phase information is obtained by using a so-called fringe scan method. In the fringe scan method, the mask stage 150 scans the diffraction grating 148a by about one pitch in a direction perpendicular to the line of the diffraction grating or the x direction, and the image pickup means 186 photographs plural interference fringes.

The plural captured interference fringes sent from the image pickup means 186 to the controller 190 via the cable 188, and the controller 190 obtains the phase information. The controller 190 can use, for example, an electronic Moiré method in obtaining the phase information. The interference fringe has a carrier fringe as shown in FIG. 7 in this embodiment, and the carrier fringe that is prepared by the controller 190 or previously produced and stored in the memory 192 should be multiplied by the captured interference fringe. Use of the electronic Moiré method is advantageous from a viewpoint of the time because the phase information can be taken from one interference fringe.

Next, the wave front aberration of the projection optical system 160 in the y direction is measured (step 1004). Similar to the step 1002, the condenser lens 126 condenses the light into the first mask 142. In step 1004, the driving mechanism (not shown) moves the second illumination optical system 120 and the first mask 142 relative to each other so that the light from the condenser lens 126 irradiates only the 90° orienting slit 144b.

Since the slit 144b has a width smaller than the diffraction limit, the light exited from the slit 144b becomes the diffraction light having an equiphase wave front. On the other hand, the light diffraction in the x direction or the longitudinal direction of the slit 144b is so small that the condenser lens 126 condenses into the slit 144b the light that has a NA equal to or greater than the NA of the projection optical system 160 at the object side or the reticle side. Thereby, the light can be irradiated onto the entire pupil surface in the projection optical system 160. The light diffracted in the width direction of the slit 144b has an equiphase wave front.

The slit 144b diffracts the light, and the light has an equiphase wave front in the y direction and is amplitude-split by the diffraction grating 148b of the light splitting means 146 in the y direction. Plural amplitude-split lights are imaged on the second mask 180 by the projection optical system 160. In other words, a pitch of the diffraction grating 148b is determined and the light splitting means 146 is positioned by the mask stage 150 so that among the lights that are diffracted by the slit 144b and diffraction grating 148b, the 0th order light images on the slit 181b and the 1st order diffracted light images on the window 183b in the light splitting means 180 the second mask 180. The light-shielding part on the second mask 180 shields other diffracted lights. The −1st order diffracted light may be used instead of the 1st order diffracted light.

The light that passes the window 183b receives the influence of the wave front aberration of the projection optical system 160. On the other hand, the slit 181b has a width smaller than the diffraction grating and thus the light exited from the slit 181b spread in the y direction, as the diffracted light having an equiphase wave front from which the wave front aberration information of the projection optical system 160 is removed in the y direction. The fringe scan method is also used to obtain the phase of the interference fringe, similar to the step 1002. In the fringe scan method, the mask stage 150 scans the diffraction grating 148b by one pitch in a direction perpendicular to the line of the diffraction grating or the b direction, and the image pickup means 186 photographs plural interference fringes.

The plural captured interference fringes sent from the image pickup means 186 to the controller 190 via the cable 188, and the controller 190 obtains the phase information. The controller 190 can use, for example, an electronic Moiré method in obtaining the phase information. Since the wave front from the slit 181b has an equiphase wave front in the y direction, the phase measured in the step 1004 contains the wave front aberration information in the y direction of the projection optical system 160.

Next, the controller 190 obtains the wave front aberration information of the projection optical system 160 by connecting the wave front aberration information in the x direction and the wave front aberration information in the y direction of the projection optical system 160 obtained in the steps 1002 and 1004 (step 1006). In addition, repetitions of steps 1002 and 1004 with different measuring angles of view can provide the wave front aberration information of the projection optical system 160 for all the angles of view (step 1008). The controller 190 can calculate the distortion component of the projection optical system 160 by extracting the rotationally asymmetrical component from the wave front aberration for each angle of view (step 1010). The controller 190 can obtain the curvature of field of the projection optical system 160 from the rotationally symmetrical component of the wave front aberration (step 1012).

Thus, this embodiment can measure the wave front aberration of the projection optical system 160 for plural angles of view, the distortion in the angle of view, and curvature of field. Of course, only the steps 1002 to 1006 are conducted for one angle so as to measure only the wave front aberration for one angle of view.

As discussed above, in this embodiment, the second illumination optical system 120 serves as an alignment optical system that provides an alignment between the mask 152 and the plate 172. The light is irradiated onto the alignment mark (not shown) arranged on the mask stage 150 using the condenser lens 126. The illuminated alignment mark forms an intermediate image on the reference mark 128 by the condenser lens 126 and the optical system 127. The optical system 129 on the image pickup means 130, such as a CCD, images the intermediate image of the alignment mark and the reference mark. The alignment of the mask stage 150 uses a measurement result of an offset amount between the alignment mark image and the reference mark image on the image pickup means 130. Similarly, the wafer stage 170 is aligned through imaging of the alignment mark (not shown) on the wafer stage 170 onto the image pickup means 130 via the projection optical system 160.

This embodiment commonly uses the alignment scope and part of the measuring apparatus 101 (illumination part), simplifying the structure and reducing the cost.

Figure 9:
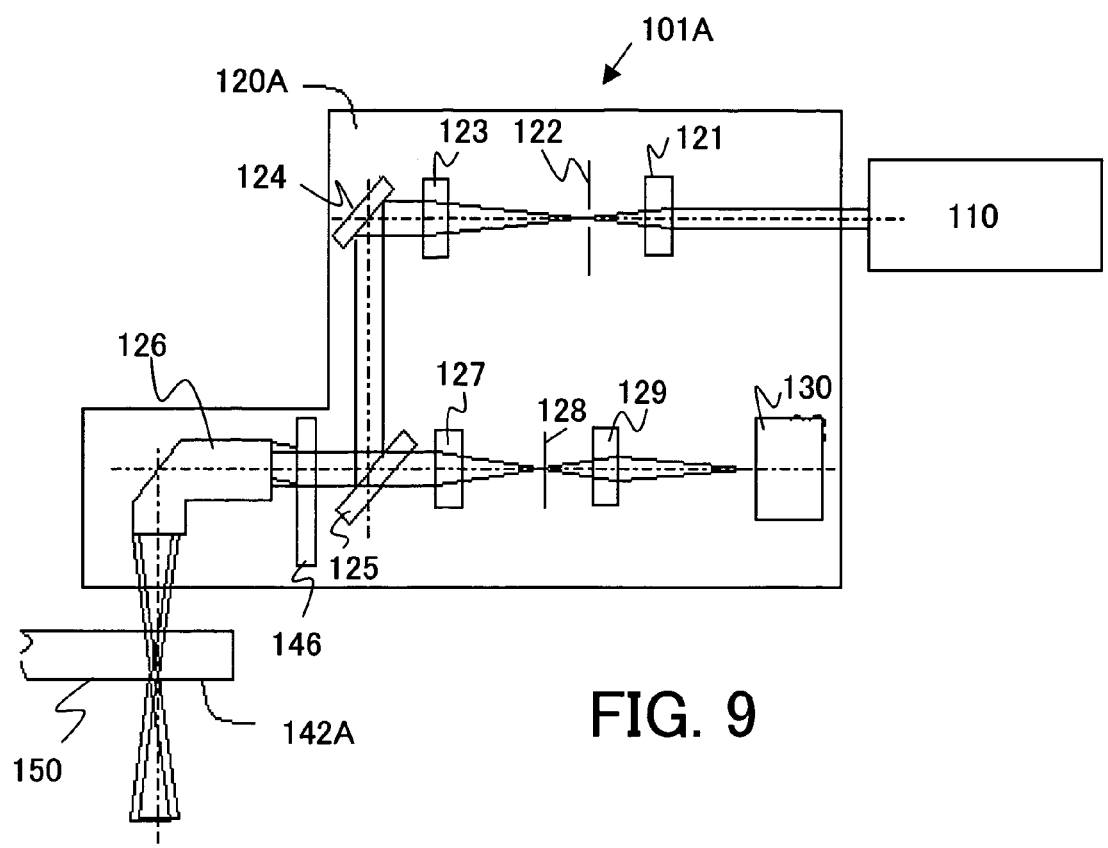
FIG. 9 is an optical-path diagram of a second illumination optical system, a light splitting means and a first mask in the measuring apparatus according to the second embodiment of the present invention, applicable to the exposure apparatus shown in FIG. 1.
Figure 10:
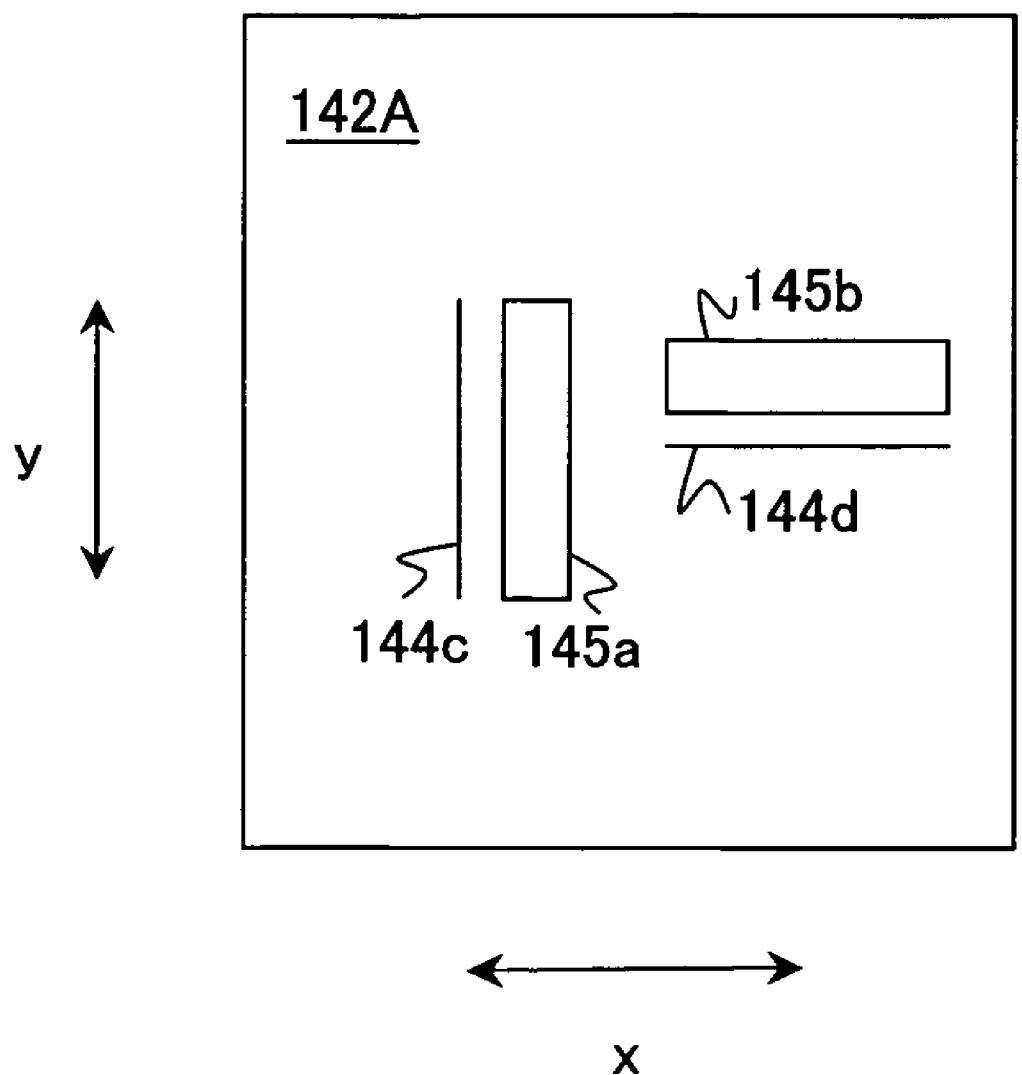
FIG. 10 is a schematic plane view of a second mask shown in FIG. 9.

Referring now to FIGS. 8 to 10, a description will be given of the measuring apparatus 101A according to a second embodiment of the present invention. The measuring apparatus 101A differs from the measuring apparatus 101 shown in FIG. 2 in a second illumination optical system 120A, a configuration of a light splitting means 146, and a first mask 142A. Those elements, which are the corresponding elements in the first embodiment, are designated by the same reference numerals, and a duplicate description thereof will be omitted. When the measuring apparatus 101A is used, the reference numeral 101 in FIG. 1 is replaced with 101A. Here, FIG. 9 is an optical-path diagram of the second illumination optical system 120A, the light splitting means 146 and the first mask 142A in the measuring apparatus 101A.

This embodiment is common to the first embodiment in that the measuring apparatus 101A uses the second illumination apparatus 120A that serves as an alignment scope and simplifies the structure. the optical system 121 to the image pickup means 130 in the second illumination optical system 120A have similar functions, although a condensing point of the condenser lens 126 is set to the first mask 142A on the mask stage 150.

The measuring apparatus 101A uses the light splitting means 146 shown in FIG. 4, but is different from the first embodiment in that the light splitting means 146 is provided between the condenser lens 126 and the half mirror 125 in the second illumination optical system 129 shown in FIG. 2 (or uses the second illumination optical system 120A). As a result, plural lights that are amplitude-split by the light splitting means 146 enter the condenser lens 126. The diffraction grating 148a corresponds to the slit 144c and window 145a in the first mask 142A, and the diffraction grating 148b corresponds to the slit 144d and the window 145b.

This embodiment differs from the first embodiment in that the first mask 142A is integrated with a substrate (not shown) (corresponding to the substrate 140) in the mask stage 150 instead of the side of the second illumination optical system 120A. This substrate is made, for example, of a transparent substrate, such as quartz and calcium fluoride. The first mask 142A is formed at one of the sides of this substrate. The condenser lens 126 condenses the light into the first mask 142A arranged on the mask stage 150. The condensed light provides a σ=1 illumination, similar to the NAo of the projection optical system 160 at the reticle side or the object side. Plural lights that are amplitude-split by the light splitting means 146 enter the condenser lens 126, and thus plural images are condensed into the first mask 142A. A size of the condensed image is restricted to a size determined by the field stop 122.

FIG. 10 shows a structure of the first mask 142A. Here, FIG. 10 is a schematic plane view of the first mask 142A. The first mask 142A includes a pair of a 0° orienting slit 144c and a window 145a, and a pair of a 90° orienting slit 144d and a window 145b. The pair of the slit 181a and window 183a and the pair of the slit 181b and window 183b have the same width and length but different orientations. A width Δr of the slits 144c and 144d is smaller than a diffraction limit defined as follows, where NAi is an NA of the projection optical system 160 at the reticle side or an object surface side, and λ is a wavelength of the exposure light.

$$\Delta r < 0.5 \cdot \lambda / NAi \qquad \text{[EQUATION 4]}$$

The equiphase of the light diffracted from the slit can be maintained in a range of NAi when the width of the slits 144c and 144d is defined by Equation 4. On the other hand, the width Δr' of the windows 145a and 145b is smaller than λ/NAi. While Equation 3 is applicable, the width Δr' is made wider from the viewpoint of the light intensity, because the light that pass the windows 145a and 145b then pass the slit smaller than the diffraction limit at the wafer side as discussed later, and no equiphase is necessary at the reticle side.

A pitch of the diffraction grating 148a is determined and the mask stage 150 positions the first mask 142A so that among the lights that are diffracted by the diffraction grating 148a, the 0th order light images on the slit 144c and the 1st order diffracted light images on the window 145a. The light-shielding part on the first mask 142A shields other diffracted lights. The −1st order diffracted light may be used instead of the 1st order diffracted light, and 1st order diffracted lights may be used instead of the 0th order light. The second mask 180 and the image pickup means 186 to the memory 192 in the measuring apparatus 101A are similar to those in FIG. 1.

Referring now to FIG. 8, a description will be given of an operation of the measuring apparatus 101A. First, the wave front aberration of the projection optical system 160 in the x direction is measured (step 1002). Similar to the step 1002 in the first embodiment, the condenser lens 126 condenses the light into the first mask 142A. In step 1002, the driving mechanism (not shown) moves the illumination optical system 120A and the mask stage 150 relative to each other so that the light from the condenser lens 126 irradiates only the 0° orienting slit 144c and window 145a. The light that has passed the slit 144c has an equiphase wave front in the x direction in FIG. 10 as discussed for the first embodiment. The light that passes the window 145a contains the aberration of the second illumination optical system 120A. The slit 144c and window 145a in the first mask 142A image on the second mask 180 on the wafer stage 170 by the projection optical system 160. The wafer stage 170 is driven and the position of the second mask 180 is adjusted so that the slit 144c in the first mask 145a images on the window 183a in the second mask 180 and the window 145a images on the slit 181a.

The light that is diffracted by the slit 181a has an equiphase wave front in the x direction. On the other hand, the wave front that passes the window 183a has the wave front aberration information of the projection optical system 160 in the x direction because the wave front is shaped into an equiphase wave front in the x direction by the first slit 144c and then passes the projection optical system 160. Therefore, the phase information derived from the interference fringe observed by the image pickup means 186 provides the wave front aberration information of the projection optical system 160 in the x direction. Similar to the first embodiment, calculations of the phase information from the interference fringe may drive the diffraction grating 148a by the driving means (not shown) using the fringe scan method. Alternatively, the electronic Moiré method may be used.

In order to calculate the wave front aberration of the projection optical system 160 in the y direction in the step 1004, a similar measurement is conducted to the step 1002 using the diffraction grating 148b in the light splitting means 146, the slit 144d and window 145b in the first mask 142A, and the slit 181b and window 183b in the second mask 180.

Next, the controller 190 obtains the wave front aberration information of the projection optical system 160 by connecting the wave front aberration information in the x direction and the wave front aberration information in the y direction of the projection optical system 160 obtained in the steps 1002 and 1004 (step 1006). In addition, repetitions of steps 1002 and 1004 with different measuring angles of view can provide the wave front aberration information of the projection optical system 160 for all the angles of view (step 1008). The controller 190 can calculate the distortion component of the projection optical system 160 by extracting the rotationally asymmetrical component from the wave front aberration for each angle of view (step 1010). The controller 190 can obtain the curvature of field of the projection optical system 160 from the rotationally symmetrical component of the wave front aberration (step 1012).

Thus, this embodiment can measure the wave front aberration of the projection optical system 160 for plural angles of view, the distortion in the angle of view, and curvature of field. Of course, only the steps 1002 to 1006 are conducted for one angle so as to measure only the wave front aberration for one angle of view.

Even in this embodiment, the second illumination optical system 120A serves as an alignment optical system that provides an alignment between the mask 152 and the plate 172, although the light splitting means 146 is removed from the optical path at the time of alignment measurement. As a result, the second illumination optical system 120A substantially exhibits similarly to the second illumination optical system 120. This embodiment also commonly uses the alignment scope and part of the measuring apparatus 101A (illumination part), simplifying the structure and reducing the cost. Of course, they may be configured as separate members.

Figure 11:
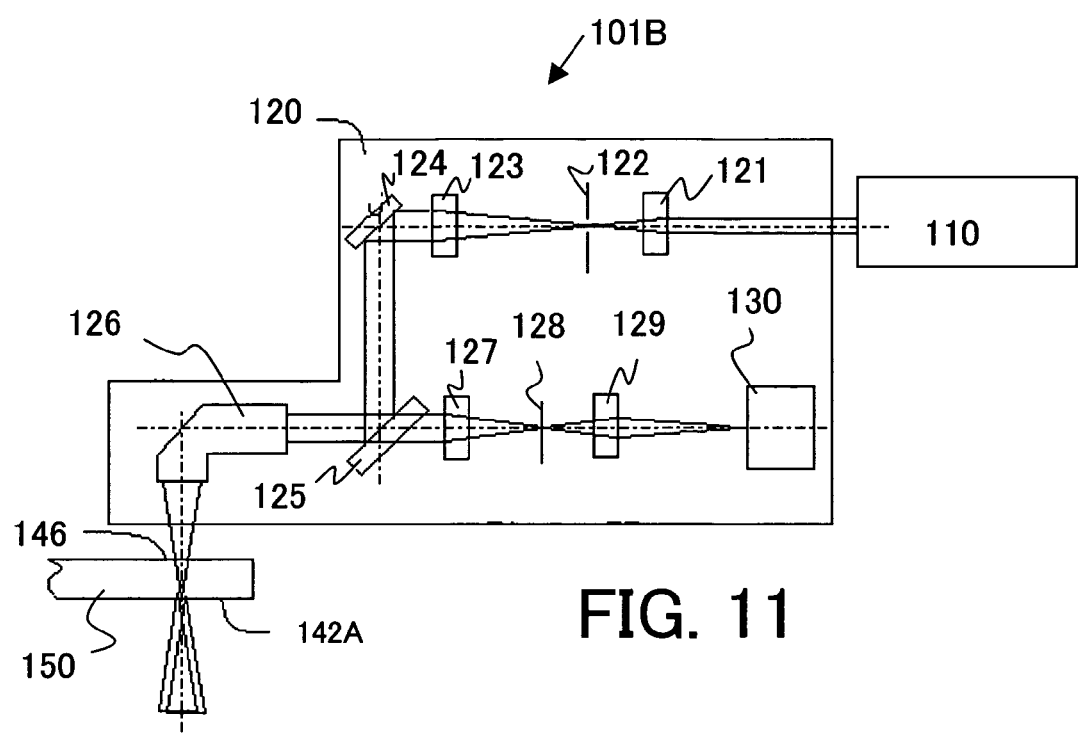
FIG. 11 is an optical-path diagram of a second illumination optical system, a light splitting means and a first mask in the measuring apparatus according to the third embodiment of the present invention, applicable to the exposure apparatus shown in FIG. 1.

Referring now to FIGS. 10 and 11, a description will be given of the measuring apparatus 101B according to a third embodiment of the present invention. The measuring apparatus 101B differs from the measuring apparatuses 101 and 101A in a first mask 142A and a configuration of a light splitting means 146. Those elements, which are the corresponding elements in FIGS. 2 and 9, are designated by the same reference numerals, and a duplicate description thereof will be omitted. When the measuring apparatus 101B is used, the reference numeral 101 in FIG. 1 is replaced with 101B. Here, FIG. 11 is an optical-path diagram of the second illumination optical system 120, the light splitting means 146 and the first mask 142A in the measuring apparatus 101B.

This embodiment is common to the first embodiment in that the measuring apparatus 101B uses the second illumination apparatus 120 that serves as an alignment scope and simplifies the structure. The optical system 121 to the image pickup means 130 in the second illumination optical system 120A have similar functions, although a condensing point of the condenser lens 126 is set to the first mask 142A on the mask stage 150.

The measuring apparatus 101B uses the light splitting means 146 shown in FIG. 4, but arranges the light splitting means 146 on a substrate (not shown) mounted on the mask stage 150 on the side of the second illumination optical system 120. The diffraction grating 148a corresponds to the slit 144c and window 145a in the first mask 142A, which will be described later, and the diffraction grating 148b corresponds to the slit 144d and the window 145b. In addition, this embodiment arranges the first mask 142A on a substrate (not shown) mounted on the mask stage 150 on the side of the projection optical system 160. This substrate is made, for example, of a transparent substrate, such as quartz and calcium fluoride. The light splitting means 146 is formed at one side of this substrate and the first mask 142A is formed at the other side of this substrate. The condenser lens 126 condenses the light into the first mask 142A arranged on the mask stage 150. The condensed light provides a σ=1 illumination, similar to the NAo of the projection optical system 160 at the reticle side or the object side. Plural lights are amplitude-split by the light splitting means 146 before entering the condenser lens 126, and thus plural images are condensed into the first mask 142A. A size of the condensed image is restricted to a size determined by the field stop 122.

A pitch of the diffraction grating 148a is determined so that among the lights that are diffracted by the diffraction grating 148a, the 0th order light images on the window 145a and the 1st order diffracted light images on the slit 144c. The light-shielding part on the first mask 142A shields other diffracted lights. The −1st order diffracted light may be used instead of the 1st order diffracted light, and ±1st order diffracted lights may be used instead of the 0th order light. The second mask 180 and the image pickup means 186 to the memory 192 in the measuring apparatus 101B are similar to those in FIG. 1.

The operation of the measuring apparatus 101B is similar to that of the measuring apparatus 101A. This embodiment also commonly uses the alignment scope and part of the measuring apparatus 101A (illumination part), simplifying the structure and reducing the cost. In particular, this embodiment does not require the slit and diffraction grating in the second illumination optical system 120, and thus can use the conventional alignment scope in the exposure apparatus advantageously. Of course, they may be configured as separate members.

Figure 12:
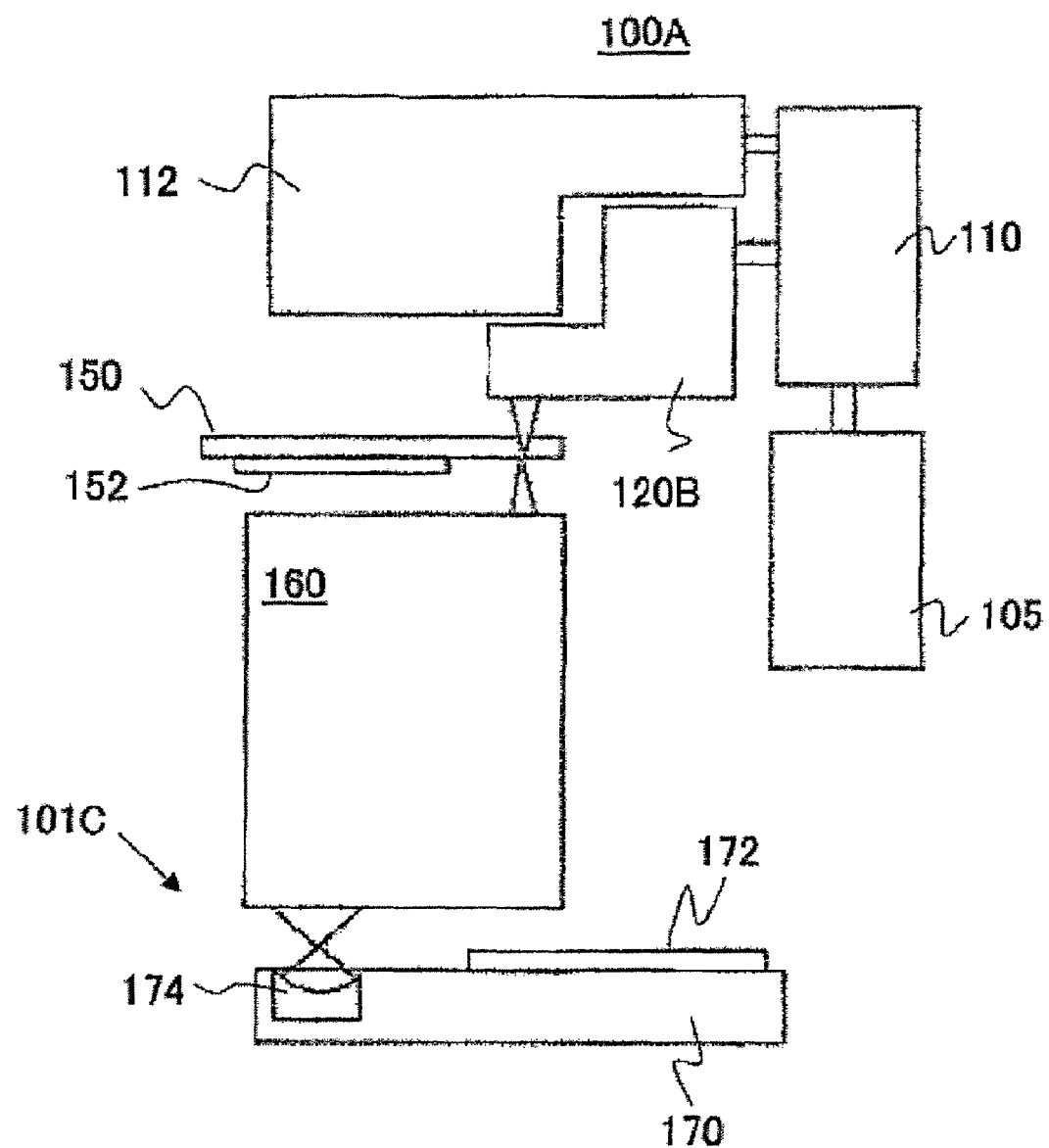
FIG. 12 is a schematic block diagram of an exposure apparatus mounted with a measuring apparatus common to fourth and fifth embodiments of the present invention.
Figure 13:
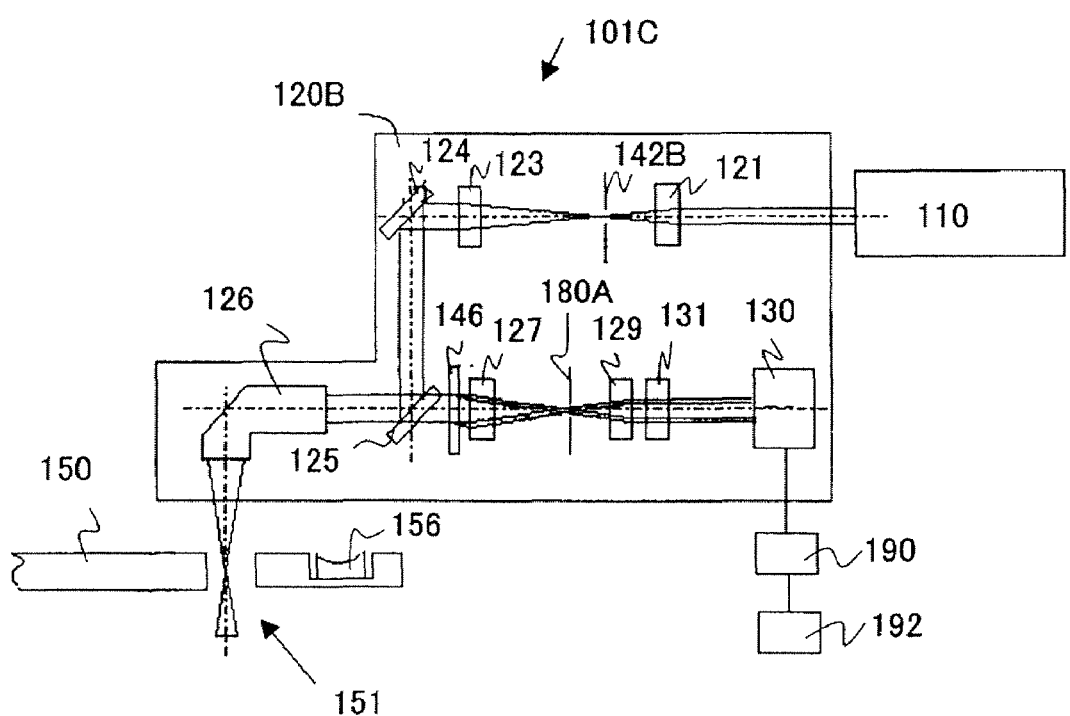
FIG. 13 is an optical-path diagram of a second illumination optical system, a light splitting means and first and second masks in the measuring apparatus according to the fourth embodiment of the present invention, applicable to the exposure apparatus shown in FIG. 12.

Referring now to FIGS. 12 and 13, a description will be given of the measuring apparatus 101C according to a fourth embodiment of the present invention and an exposure apparatus 100A having the same. Here, FIG. 12 is a schematic block diagram of the exposure apparatus 100A. FIG. 13 is an optical-path diagram of a second illumination optical system 120B, the light splitting means 146, a first mask 142B, and a second mask 180A. The measuring apparatus 101C of the fourth embodiment differs from the measuring apparatus 101 to 101B of the first to third embodiments in that the image pickup means 186 is provided in the second illumination optical system 120B. Those elements, which are the corresponding elements in the first to third embodiment, are designated by the same reference numerals, and a duplicate description thereof will be omitted.

The first mask 142B has a similar structure to that of the first mask 142 shown in FIG. 3, and is inserted between the optical systems 121 and 123 instead of the field stop 122. However, a width Δr of the slits 144a and 144b is smaller than a diffraction limit defined as follows, where NAo is an NA of the projection optical system 160 at the reticle side or an object surface side, λ is a wavelength of the exposure light, and β is an imaging magnification by the optical system 123 and the condenser lens 126.

$$\Delta r < 0.5 \cdot \lambda / NAo \quad \text{[EQUATION 5]}$$

The equiphase of the light diffracted from the slit can be maintained in a range of NAo when the slit width is defined by Equation 5. A greater length Lr improves the light intensity, but should be smaller than the isoplanatic area where the identity of the aberration of the projection optical system 160 can be maintained. The first mask 142B can be driven by a driving mechanism (not shown), and the illumination area can be selected between the slits 144a and 144b.

The mask stage 150 has a perforation hole 151 through which the light passes, as shown in FIG. 12. The light splitting means 146 is arranged between the half mirror 125 and the optical system 127.

The second mask 180A is configured similarly to the second mask 180 shown in FIG. 5, and provided between the optical systems 127 and 129 instead of the reference mark 128. A width Δw of the slits 181a and 181b is smaller than the diffraction limit determined by the following equation, where β' is an imaging magnification by the condenser optical system 127 and the condenser lens 126:

$$\Delta w < 0.5 \cdot \lambda / NAo \cdot \beta' \quad \text{[EQUATION 6]}$$

The equiphase of the light diffracted from the slits 181a and 181b can be maintained in a range of NAo when the width Δw of the slits 181a and 181b is defined by Equation 6. The width Δw' is determined by the spatial frequency of the projection optical system 160 to be measured. It is made narrow for low frequency measurements, and made wide for high frequency measurements. Δw' is given by the next equation where f is a spatial frequency of a pupil of the projection optical system 160, and the wave front aberration that has one period at the pupil radius has a frequency f of 1:

$$\Delta w' = 2 \cdot f \cdot \lambda / NAi \cdot \beta' \quad \text{[EQUATION 7]}$$

A greater length Lw of the slit 181a and window 183a improves the light intensity, but should be smaller than the isoplanatic area where the identity of the aberration of the projection optical system 160 can be maintained.

A pupil conjugate optical system 131 is provided between the optical system 129 and image pickup means 130.

The measuring apparatus 101C further includes a reflecting means 174 on the image surface of the wafer stage 170. In FIG. 12, the reflecting means 174 is a concave mirror having a center of curvature at a condensing point of the light, and the reflecting means 174 approximately regularly reflects the light. The measuring apparatus 101C further includes another reflecting means 156 on the object surface of the mask stage 150. In FIG. 13, the reflecting means 156 is a concave mirror having a center of curvature at a condensing point of the light, and the reflecting means 156 approximately regularly reflects the light. It is sufficient that the reflecting means 156 is a concave or convex spherical mirror having a known shape or wave front phase using another means.

Figure 14:
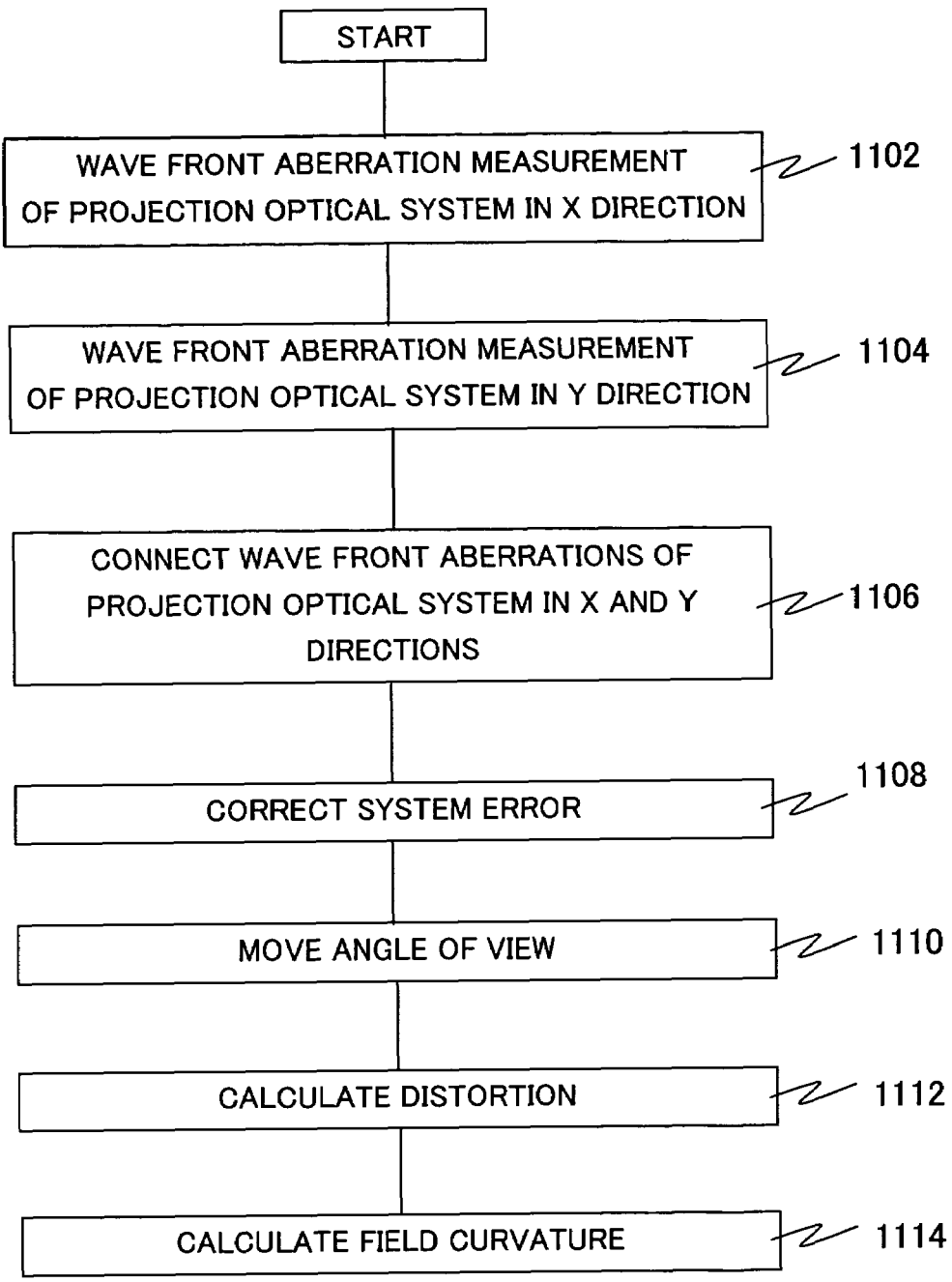
FIG. 14 is a flowchart for explaining an operation of the measuring apparatus shown in FIG. 12.

Referring now to FIG. 14, a description will be given of an operation of the measuring apparatus 101C. Here, FIG. 14 is a flowchart for explaining the operation of the measuring apparatus 101C. First, the wave front aberration of the projection optical system 160 in the x direction is measured (step 1102).

In FIG. 13, the light emitted from the light source section 105 is deflected to the second illumination optical system 120B for imaging performance measurements by the deflection optical system 110. The light from the deflection optical system 110 is condensed into the optical system 121 for the illumination optical system, and irradiated onto the first mask 142B. The light from the first stop 142B is collimated by the optical system 123, deflected by the deflection mirror 124 and half mirror 125, and introduced into the condenser lens 126. In step 1102, the driving mechanism (not shown) moves the first mask 142B so as to irradiate only the 0° orienting slit 144a.

Since the slit 144a has a width smaller than the diffraction limit, the light exited from the slit 144a becomes the diffraction light having an equiphase wave front in the x direction. On the other hand, the light diffraction in the y direction or the longitudinal direction of the slit 144a is so small that the condenser lens 126 condenses into the slit 144a the light that has a NA equal to or greater than the NA of the projection optical system 160 at the object side or the reticle side, at least in the y direction in FIG. 3. Thereby, the light can be irradiated onto the entire pupil surface in the projection optical system 160. The light diffracted in the width direction of the slit 144a has an equiphase wave front.

The light diffracted by the slit 144a images on the object surface by the optical system 123 and the condenser lens 126. The imaging light on the object surface is condensed by the projection optical system 160 into the image surface on the side of the wafer stage 170, and reflected by the reflecting means 174. The reflecting means 174 approximately regularly reflects the light. The reflected light is condensed into the object surface on the side of the mask stage 150 through the same return optical path of the projection optical system 160, and enters the light splitting means 146 via the condenser lens 126 and the half mirror 125. The light splitting means 146 amplitude-splits the light in the x direction, and the amplitude-split light is condensed into the second mask 180A by the optical system 127 for the image pickup system.

A pitch of the diffraction grating 148a is determined so that among the lights that are diffracted by the diffraction grating 148a, the 0th order light images on the slit 181a and the 1st order diffracted light images on the window 183a. The light-shielding part on the second mask 180A shields other diffracted lights. The −1st order diffracted light may be used instead of the 1st order diffracted light. The light that passes the window 183a receives the influence of the wave front aberration of the projection optical system 160. On the other hand, the slit 181a has a width smaller than the diffraction limit, and thus the light exited from the slit 181a spreads in the x direction, as the diffracted light having an equiphase wave front from which the wave front aberration information of the projection optical system 160 is removed in the x direction.

The light that has passed the second mask 180A is photographed by the image pickup means 130 via the optical system 129 and the pupil conjugate optical system 131. The image pickup means 130 observes the interference fringe of the light having an equiphase wave front in the x direction with the light that contains the wave front aberration information of the projection optical system. A calculation of the phase information from the interference fringe provides the wave front aberration of the projection optical system 160 in the x direction with precision.

The fringe scan method is used to obtain the phase from the interference fringe. The fringe scan method provides a necessary modulation to a phase by scanning the diffraction grating 148a in the light splitting means 146 by about one pitch in a direction perpendicular to the line of the diffraction grating or the x direction in FIG. 4. A driving mechanism (not shown) in the light splitting means 146 drives the diffraction grating 148a. The plural captured interference fringes sent from the image pickup means 130 to the controller 190 via the cable 188, and the controller 190 obtains the phase information. Similar to the first embodiment, the controller 190 can use the electronic Moiré method to obtain the phase information. This embodiment allows the captured interference fringe to pass the projection optical system twice, and measures a double wave front aberration of the projection optical system 160. Therefore, a correction is made through an operation (or divided by 2).

Next, the wave front aberration of the projection optical system 160 in the y direction is measured (step 1104). In the step 1104, a driving mechanism (not shown) drives the first mask 142B, and uses only the 90° orienting slit 144b. In response, the diffraction grating 148b, the slit 181b and the window 183b are used. The optical system 121 irradiates the light onto the 90° orienting slit 144b in the first mask 142B. The slit 144b diffracts the light, and the light has an equiphase wave front in the y direction and enters the condenser lens 126 via the optical system 123, the deflection mirror 124 and half mirror 125.

The condenser lens 126 condenses the slit 144b in the first mask 142B into the object surface of the projection optical system 160. The imaging light on the object surface is condensed by the projection optical system 160 into the image surface of the wafer stage 170, reflected by the reflecting means 174, and condensed into the object surface of the mask stage 150 through the same return optical path of the projection optical system 160. The condensed light enters the diffraction grating 148b in the light splitting means 146 via the condenser lens 126 and the half mirror 125. The diffraction grating 148b amplitude-splits the light in the y direction. Among the amplitude-split lights, the 0th order light is condensed into the slit 181b in the second mask 180A by the optical system 127, and the 1st order diffracted light is condensed into the window 183b. Alternatively, the −1st order diffracted light may be condensed into the window.

The light diffracted through the slit 181b has an equiphase wave front in the y direction. On the other hand, the light that passes the window 183b has the wave front aberration information of the projection optical system 160. Therefore, the image pickup means 130 observes the phase information derived from the interference fringe of the projection optical system in the y direction. Similar to the step 1102, calculations of the phase information from the interference fringe may use the fringe scan method by driving the diffraction grating 148b in the y direction by about one pitch. Alternatively, the electronic Moiré method may be used. Similar to the step 1102, the captured interference fringe passes through the projection optical system twice, and measures the double wave front aberration of the projection optical system 160. Therefore, it is corrected through an operation.

Next, the controller 190 obtains the wave front aberration information of the projection optical system 160 by connecting the wave front aberration information in the x direction and the wave front aberration information in the y direction of the projection optical system 160 obtained in the steps 1102 and 1104 (step 1106).

However, it is necessary to exclude from the measured wave front the influence of the wave front aberration generated by the optical system 123, the deflection mirror 124, the half mirror 125, the condenser lens 126, the light splitting means 146, and the optical system 127. Therefore, a correction using the reflection means 156 follows (step 1108). The reflecting means 156 is a concave or convex spherical mirror having a known shape or wave front phase using another means. The reflecting means 156 is a concave mirror in FIG. 13, and arranged so that the center of curvature of the reflecting means 156 accords with the condensing point of the condenser lens 126.

At this state, the similar measurements to the steps 1102 and 1104 follow, and the reflected wave front aberration from the reflecting means 156 is measured. The system error or the wave front aberration generated by the optical system 123, the deflection mirror 124, the half mirror 125, the condenser lens 126, the light splitting means 146, and the optical system 127 can be measured by removing the known reflected wave front phase of the reflecting means 156 from this measuring result. The wave front aberration of the projection optical system 160 can be measured with precision by removing this system error from the measurement result obtained in the step 1108.

In addition, repetitions of steps 1002 and 1004 with different measuring angles of view can provide the wave front aberration information of the projection optical system 160 for all the angles of view (step 1110). The controller 190 can calculate the distortion component of the projection optical system 160 by extracting the rotationally asymmetrical component from the wave front aberration for each angle of view (step 1112). The controller 190 can obtain the curvature of field of the projection optical system 160 from the rotationally symmetrical component of the wave front aberration (step 1114).

Thus, this embodiment can measure the wave front aberration of the projection optical system 160 for plural angles of view, the distortion in the angle of view, and curvature of field. Of course, only the steps 1002 to 1006 are conducted for one angle so as to measure only the wave front aberration for one angle of view. The system error correction in the step 1108 may be conducted only once prior to the step 1102, and the correction value may be stored in the calculating means so as to correct the measuring value for each angle of view.

Even in this embodiment, the second illumination optical system 120B serves as an alignment optical system that provides an alignment between the mask 152 and the plate 172. For the alignment measurement, the light splitting means 146 and the pupil conjugate optical system 131 are removed from the optical path, and the field stop 122 and the reference mark 128 is arranged instead of the first mask 142B and the second mask 180A. Thereby, the second illumination optical system 120B is turned to the second illumination optical system 120, and the alignment is available in a manner described for the first embodiment.

This embodiment houses the image pickup means in the second illumination optical system, and can commonly use most of the alignment optical system. In addition, since there is no image pickup means 186 on the wafer stage 170, the driving precision of the wafer stage 170 can be maintained and the heat emitted from the image pickup means 186 does not affect the exposure.

Figure 15:
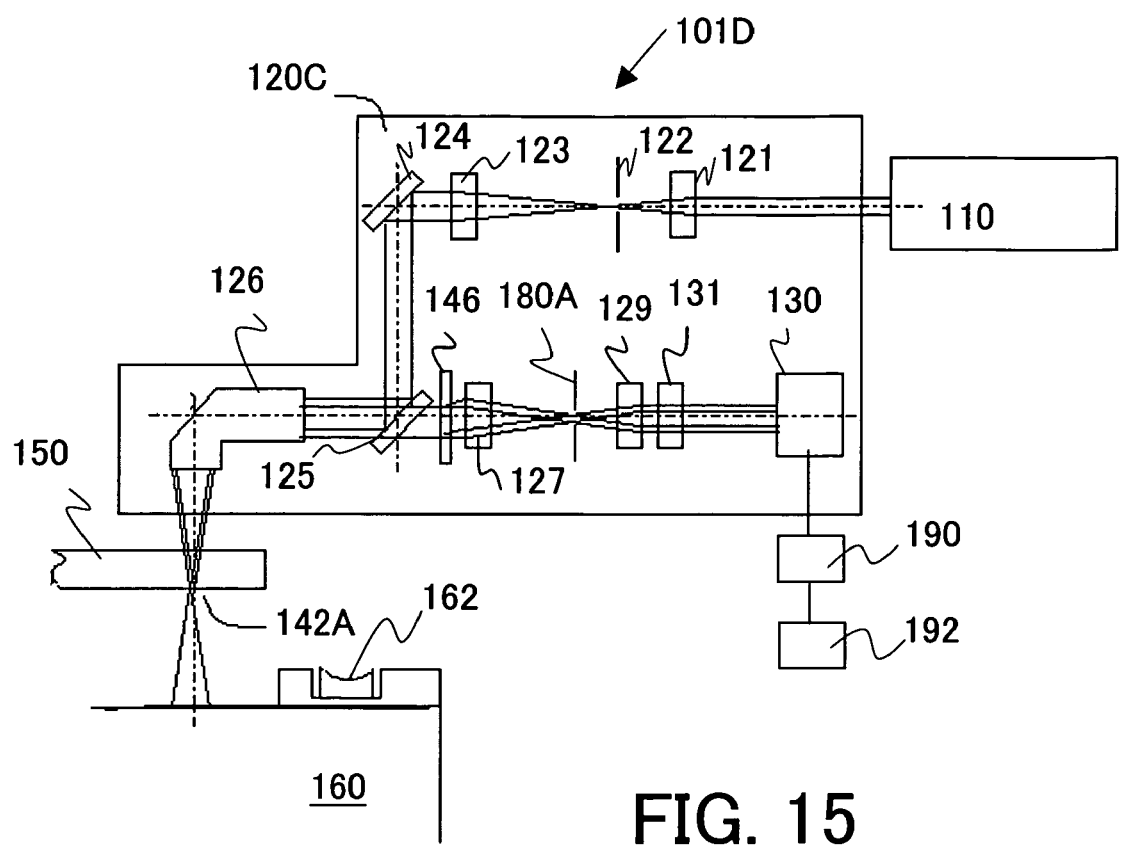
FIG. 15 is an optical-path diagram of a second illumination optical system, a light splitting means and first and second masks in the measuring apparatus according to the fifth embodiment of the present invention, applicable to the exposure apparatus shown in FIG. 12.

Referring now to FIGS. 12, 14 and 15, a description will be given of the measuring apparatus 101D according to a fifth embodiment of the present invention. The measuring apparatus 101D differs from the measuring apparatus 101C shown in FIG. 13 in that the measuring apparatus 101D includes a second illumination optical system 120C, and arranges the first mask 142A on the mask stage 150 or a dedicated reticle. Those elements in FIG. 15, which are the corresponding elements in the first to fourth embodiments, are designated by the same reference numerals, and a duplicate description thereof will be omitted. When the measuring apparatus 101D is used, the reference numeral 101C in FIG. 12 is replaced with 101D. Here, FIG. 15 is an optical-path diagram of the second illumination optical system 120C, the light splitting means 146 and the first mask 142A in the measuring apparatus 101D.

The second illumination apparatus 120C differs from the second illumination apparatus 120B in that the second illumination apparatus 120C arranges the field stop 122 instead of the first mask 142B. The first mask 142A is formed on the mask stage 150 like FIG. 9. The measuring apparatus 101D further includes another reflecting means 162 on the projection optical system 160. In FIG. 15, the reflecting means 162 is a concave mirror having a center of curvature at a condensing point of the light, and approximately regularly reflects the light. It is sufficient that the reflecting means 162 is a concave or convex spherical mirror having a known shape or wave front phase using another means. The reflecting means 162 has a structure and function similar to the reflecting means 156.

Referring now to FIG. 14, a description will be given of an operation of the measuring apparatus 101D. First, the wave front aberration of the projection optical system 160 in the x direction is measured (step 1102). Similar to the step 1102 in the fourth embodiment, the light emitted from the light source section 105 is deflected to the second illumination optical system 120C for measuring the imaging performance, via the deflection optical system 110. The light from the deflection optical system 110 is condensed into the optical system 121 for the illumination optical system, and irradiated onto the field stop 122. The field stop 122 has a size enough to irradiate a pattern on the substrate for the first mask 142A, which will be described later. The light from the field stop 122 is collimated by the optical system 123, deflected by the deflection mirror 124 and half mirror 125, and introduced into the condenser lens 126. The condenser lens 126 condenses the light into the first mask 142A on the transparent substrate on the mask stage 150.

In step 1102, the mask stage 150 is driven so as to illuminate the 0° orienting slit 144c and window 145a in the first mask 142A. The condenser lens 126 condenses the light into the slit 144c. The light that has passed the slit 144c has an equiphase wave front in the x direction. The light exited from the slit 144c is imaged onto the wafer stage 170 by the projection optical system 160, reflected by the reflecting means 174, and imaged onto the first mask 142A through the same return optical path of the projection optical system 160.

The reflecting means 174 is decentered from the imaging point at the wafer side. This configuration enables the light exited from the slit 144c to pass the projection optical system 160 twice, return to the first mask 142A, and pass the window 145a in the first mask 142A. The width in the opening in the window 145a is sufficiently larger than the diffraction limit so as to maintain the wave front aberration information of the projection optical system 160. The light from the window 145a enters the diffraction grating 148a in the light splitting means 146 via the condenser lens 126 and the half mirror 125.

The diffraction grating 148a amplitude-splits the light in the x direction. Among the amplitude-split lights, the 0th order light is condensed into the slit 181a in the second mask 180A by the optical system 127, and the 1st order diffracted light is condensed into the window 183b. Alternatively, the −1st order diffracted light may be condensed into the window. The light diffracted through the slit 181a has an equiphase wave front in the x direction. On the other hand, the light that passes the window 183a has the wave front aberration information of the projection optical system 160. Therefore, the interference fringe captured by the image pickup means 130 via the optical system 129 and pupil conjugate optical system 131 has the wave front aberration of the projection optical system 160 in the x direction.

Similar to the fourth embodiment, calculations of the phase information from the interference fringe may use the fringe scan method by driving the diffraction grating 148a in the x direction by about one pitch. Alternatively, the electronic Moiré method may be used. The captured interference fringe passes through the projection optical system twice, and measures the double wave front aberration of the projection optical system 160. Therefore, it is corrected through an operation.

Next follows a measurement of the wave front aberration of the projection optical system 160 in the y direction (step 1104). In the step 1104, the mask stage 150 drives the first mask 142A, and makes the 90° orienting slit 144d and window 145b available. In response, the diffraction grating 148b, the slit 181b and the window 183b are used. The wave front aberration of the projection optical system 160 in the y direction is calculated by the similar measurement to the step 1102.

Next, the controller 190 obtains the wave front aberration information of the projection optical system 160 by connecting the wave front aberration information in the x direction and the wave front aberration information in the y direction of the projection optical system 160 obtained in the steps 1102 and 1104 (step 1106).

However, it is necessary to exclude from the measured wave front the influence of the wave front aberration generated by the half mirror 125, the condenser lens 126, the light splitting means 146, and the optical system 127. Therefore, a correction using the reflection means 162 follows (step 1108). The reflecting means 162 is a concave or convex spherical mirror having a known shape or wave front phase using another means. The reflecting means 162 is arranged as a concave mirror in the projection optical system 160 in FIG. 15. The reflecting means 162 is arranged so that the center of curvature of the reflecting means 162 accords with the condensing point of the condenser lens 126 or the first mask 142.

At this state, the similar measurements to the steps 1102 and 1104 follow, and the reflected wave front aberration from the reflecting means 162 is measured. The condensing point is laterally shifted from the center of curvature of the reflecting means 162 so that the reflected light passes the windows 183a and 183b. The system error or the wave front aberration generated by the half mirror 125, the condenser lens 126, the light splitting means 146, and the optical system 127 can be measured by removing the known reflected wave front phase of the reflecting means 156 from this measuring result. The wave front aberration of the projection optical system 160 can be measured with precision by removing this system error from the measurement result obtained in the step 1108.

The repetitions of steps 1002 and 1004 with different measuring angles of view provide the wave front aberration information of the projection optical system 160 for all the angles of view (step 1110). The controller 190 can calculate the distortion component of the projection optical system 160 by extracting the rotationally asymmetrical component from the wave front aberration for each angle of view (step 1112). The controller 190 can obtain the curvature of field of the projection optical system 160 from the rotationally symmetrical component of the wave front aberration (step 1114).

Thus, this embodiment can measure the wave front aberration of the projection optical system 160 for plural angles of view, the distortion in the angle of view, and curvature of field. Of course, only the steps 1002 to 1006 are conducted for one angle so as to measure only the wave front aberration for one angle of view. The system error correction in the step 1108 may be conducted only once prior to the step 1102, and the correction value may be stored in the calculating means so as to correct the measuring value for each angle of view.

Even in this embodiment, the second illumination optical system 120C serves as an alignment optical system that provides an alignment between the mask 152 and the plate 172. For the alignment measurement, the light splitting means 146 and the pupil conjugate optical system 131 are removed from the optical path, and the field stop 122 and the reference mark 128 is arranged instead of the first mask 142B and the second mask 180A. Thereby, the second illumination optical system 120C is turned to the second illumination optical system 120, and the alignment is available in a manner described for the first embodiment.

This embodiment houses the image pickup means in the second illumination optical system, and can commonly use most of the alignment optical system. In addition, since there is no image pickup means 186 on the wafer stage 170, the driving precision of the wafer stage 170 can be maintained and the heat emitted from the image pickup means 186 does not affect the exposure. Moreover, this embodiment arranges the first mask 142A closer to the projection optical system 160 than the fourth embodiment, reducing the system error advantageously.

Figure 16:
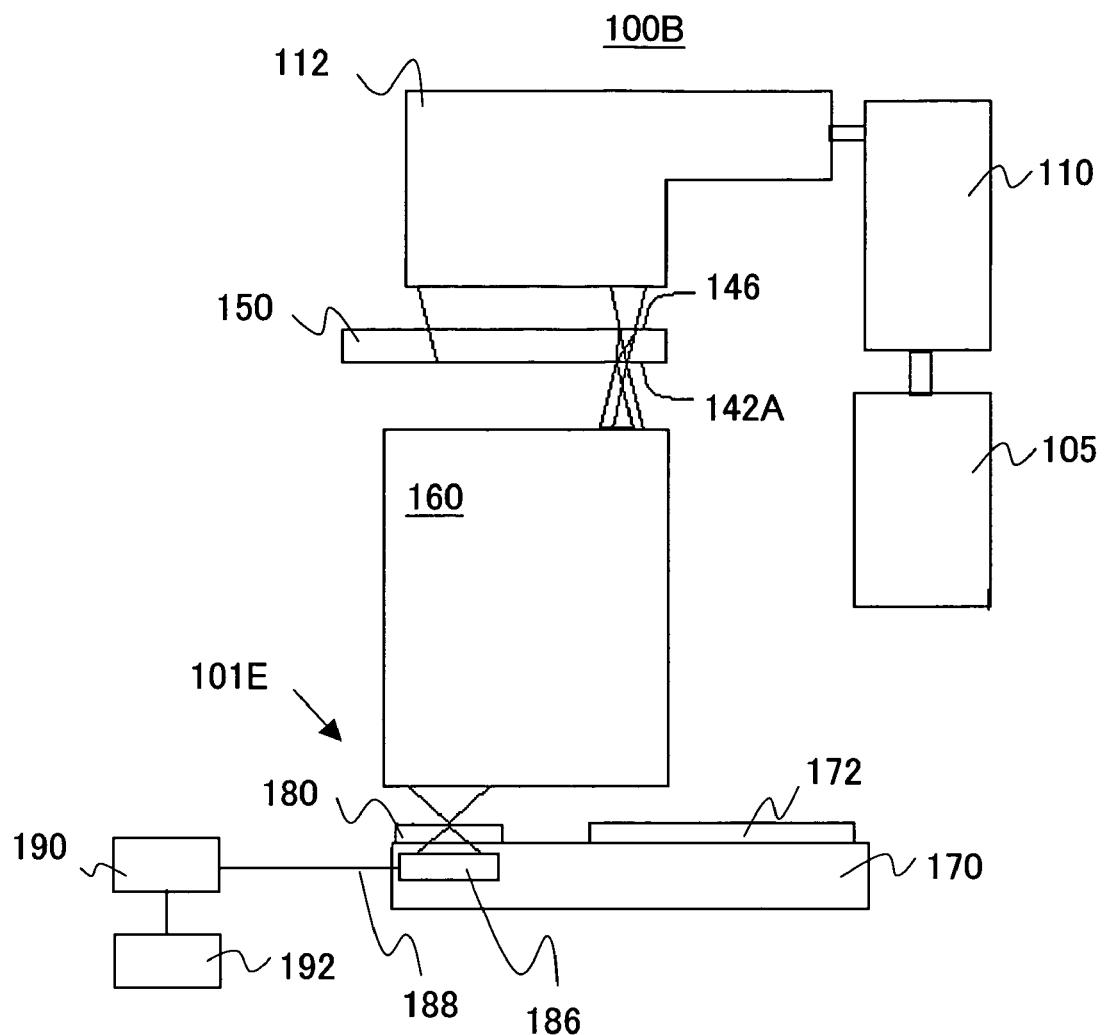
FIG. 16 is a schematic block diagram of an exposure apparatus mounted with a measuring apparatus according to a sixth embodiment of the present invention.

Referring now to FIG. 16, a description will be given of the measuring apparatus 101E according to a sixth embodiment of the present invention, and an exposure apparatus 100B having the same. The measuring apparatus 101E turns the optical system in the measuring apparatus 101B of the third embodiment from the second illumination optical system to the first illumination optical system. Those elements in FIG. 16, which are the corresponding elements in the first to fifth embodiments, are designated by the same reference numerals, and a duplicate description thereof will be omitted. Here, FIG. 16 is a schematic block diagram of the exposure apparatus 100B.

The fundamental structure is similar to the measuring apparatus 101B. A description will be given of an operation of the measuring apparatus 101E. In FIG. 16, the light emitted from the light source section 105 is deflected to the first illumination optical system 112 in the exposure apparatus 100B body, which is used for the normal exposure, via the deflection optical system 110. The light emitted from the first illumination optical system 112 is amplitude-split in the x direction by the diffraction grating 148a in the light splitting means 146. The amplitude-split lights image on the first mask 142A. Among the imaged lights, the 0th order light passes the window 145a in the first mask 142A, and the 1st order diffracted light passes the slit 144c. The slit 144c and the window 145a image on the second mask 180 by the projection optical system 160. The lights that pass the second mask 180 interfere with each other, and the image pickup means 186 observes the interference fringe. The interference fringe of the instant embodiment has a space carrier, and the phase is calculated from the interference fringe using the electronic Moiré method. The imaging performance of the projection optical system 160 can be measured using the flowchart shown in FIG. 8. This embodiment simplifies the apparatus structure because the illumination optical system used for exposure is used for the measuring apparatus 101B.

Figure 17:
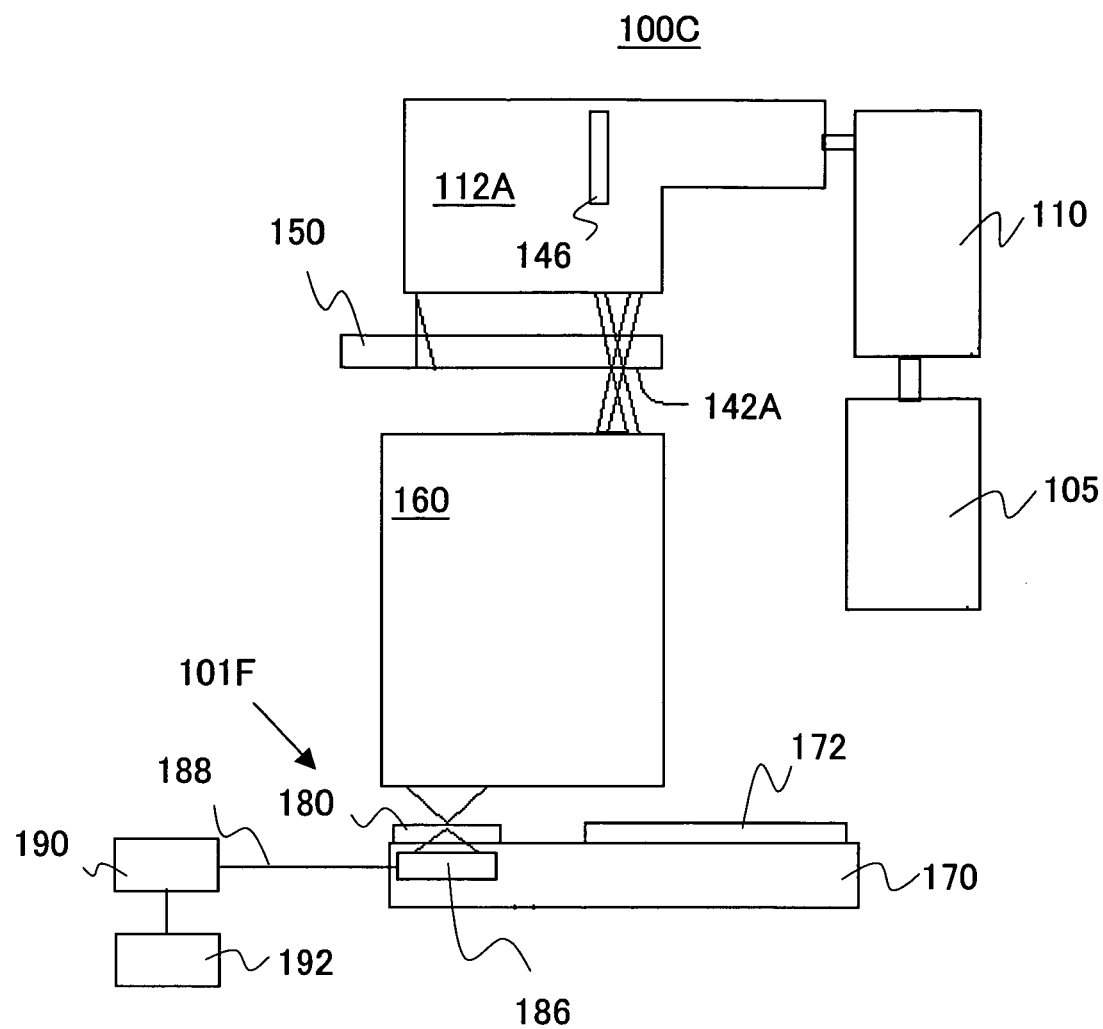
FIG. 17 is a schematic block diagram of an exposure apparatus mounted with a measuring apparatus according to a seventh embodiment of the present invention.

Referring now to FIG. 17, a description will be given of the measuring apparatus 101F according to a seventh embodiment of the present invention, and an exposure apparatus 100C having the same. The measuring apparatus 101F turns the optical system in the measuring apparatus 101A of the second embodiment from the second illumination optical system to the first illumination optical system. Those elements in FIG. 17, which are the corresponding elements in the first to fifth embodiments, are designated by the same reference numerals, and a duplicate description thereof will be omitted. Here, FIG. 17 is a schematic block diagram of the exposure apparatus 100C.

The measuring apparatus 101F differs from the measuring apparatus 101E in that the measuring apparatus 101F moved the light splitting means 146 from the mask stage 150 to the inside of the first illumination optical system 112A, and differs from the measuring apparatus 101A in that the measuring apparatus 101F moves the light splitting means 146 from the second illumination optical system 120A to the first illumination optical system 112A. The light splitting means 146 is arranged at a position, such as a σ stop, in the first illumination optical system 112A, which is conjugate with the pupil in the projection optical system 160.

The fundamental structure is similar to the measuring apparatus 101A. A description will be given of an operation of the measuring apparatus 101F. In FIG. 16, the light emitted from the light source section 105 is deflected to the first illumination optical system 112A in the exposure apparatus 100C body, which is used for the normal exposure, via the deflection optical system 110. The irradiating light is σ=1 illumination, similar to the numerical aperture of NAo of the projection optical system 160 at the reticle side or the object side. The light of σ=1, which has been amplitude-split by the light splitting means 146, is irradiated onto the first mask 142A. The first mask 142A is arranged on a transparent substrate on the mask stage 150 or a dedicated mask on the mask stage 150. FIG. 17 exemplarily shows that the first mask 142A is arranged on the substrate on the mask stage 150. The projection optical system 160 projects the first mask 142A onto the second mask 180. The lights that pass the slit 181a and window 183a in the second mask 180 interfere with each other, and the interference fringe is photographed by the image pickup means 186.

The imaging performance of the projection optical system 160 can be measured using the flowchart shown in FIG. 8, which has been described for the measuring apparatus 101A, through the fringe scan method that drives the light splitting means 146 and photographs the interference fringe, or the electronic Moiré method. This embodiment makes the apparatus structure simpler than the second embodiment. In addition, this embodiment is advantageous to the sixth embodiment in obtaining the phase information using the fringe scan method in addition to the electronic Moiré method.

Figure 18:
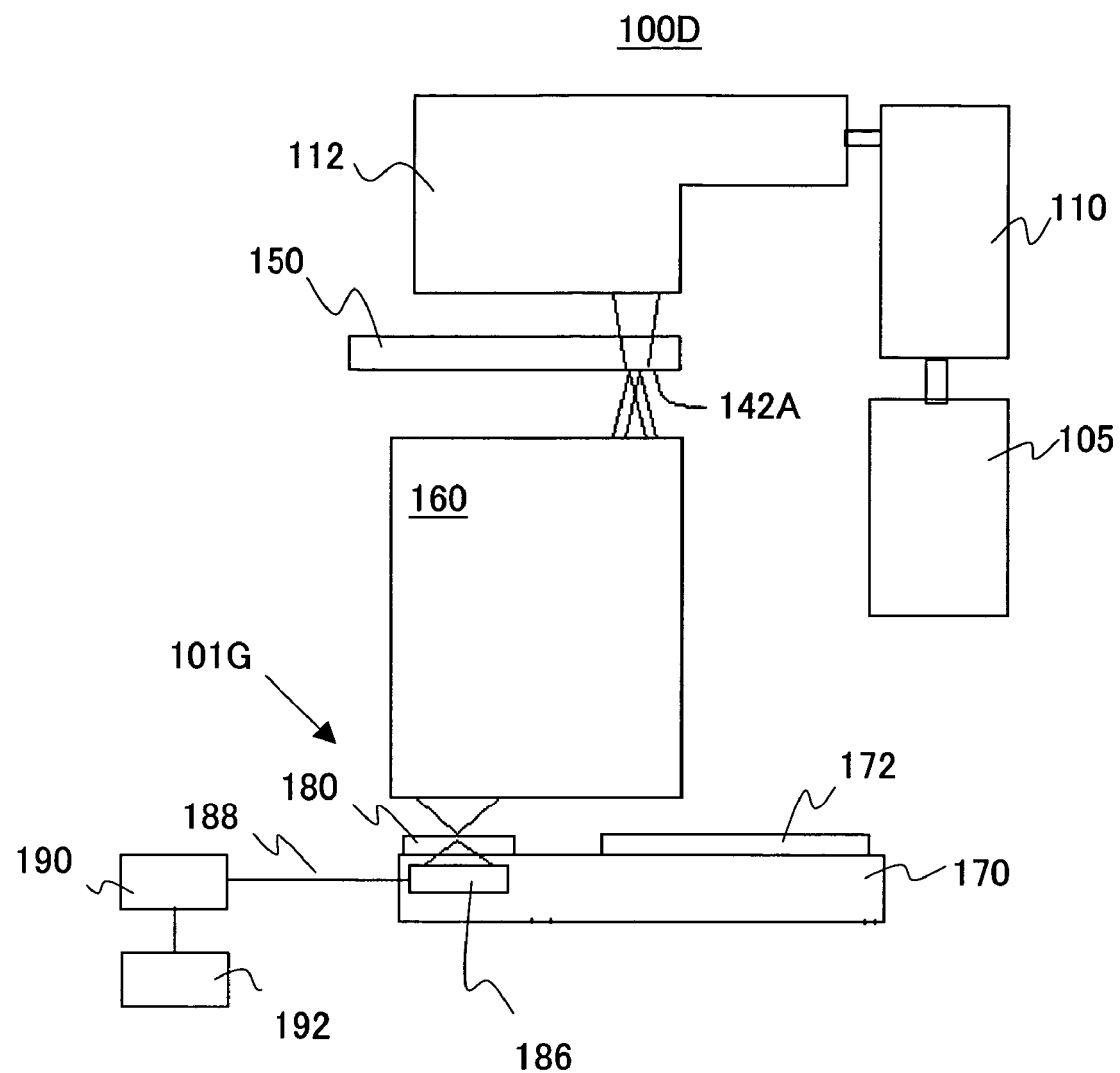
FIG. 18 is a schematic block diagram of an exposure apparatus mounted with a measuring apparatus according to an eighth embodiment of the present invention.

Referring now to FIG. 18, a description will be given of the measuring apparatus 101G according to an eighth embodiment of the present invention, and an exposure apparatus 100D having the same. The measuring apparatus 101G removes the light splitting means 146 from the measuring apparatuses 110E and 101F of the sixth and seventh embodiments. Those elements in FIG. 18, which are the corresponding elements in the first to seventh embodiments, are designated by the same reference numerals, and a duplicate description thereof will be omitted. Here, FIG. 18 is a schematic block diagram of the exposure apparatus 100D.

A description will be given of an operation of the measuring apparatus 101G. The light emitted from the light source section 105 is deflected to the first illumination optical system 112 in the exposure apparatus 100D body, which is used for the normal exposure, via the deflection optical system 110.

The first mask 142A is arranged on a transparent substrate on the mask stage 150 or a dedicated mask on the mask stage 150. FIG. 18 exemplarily shows that the first mask 142A is arranged on the substrate on the mask stage 150. The projection optical system 160 projects the first mask 142A onto the second mask 180. The lights that pass the slit 181a and window 183a in the second mask 180 interfere with each other, and the interference fringe is photographed by the image pickup means 186.

The first illumination optical system 112 turns the light into the incoherent one, the spatial coherency enough to form the interference fringe exists because intervals between the slits 144c and 144d and the windows 145a and 145b in the first mask 142A are as small as the submillimeter order. Alternatively, the spatial coherency improves if the incoherently turning unit retreats from the optical path in measuring the imaging performance. The light that has passed the first mask 142A forms the interference fringe, the projection optical system 160 images the first mask 142A onto the slits 181a and 181b and the windows 183a and 183b in the second mask 180, and the image pickup means 186 photographs the interference fringe.

In the above configuration, the imaging performance of the projection optical system 160 can be measured by obtaining the phase information from the interference fringe using the flowchart shown in FIG. 8 through the electronic Moiré method. This embodiment is advantageous to the sixth and seventh embodiments in providing a simpler apparatus structure.

Further, the present invention is not limited to these preferred embodiments, and various variations and modifications may be made without departing from the scope of the present invention. For example, the light splitting means 146 is not limited to the diffraction grating but may include an optical wedge plate and another member.

Figure 19:
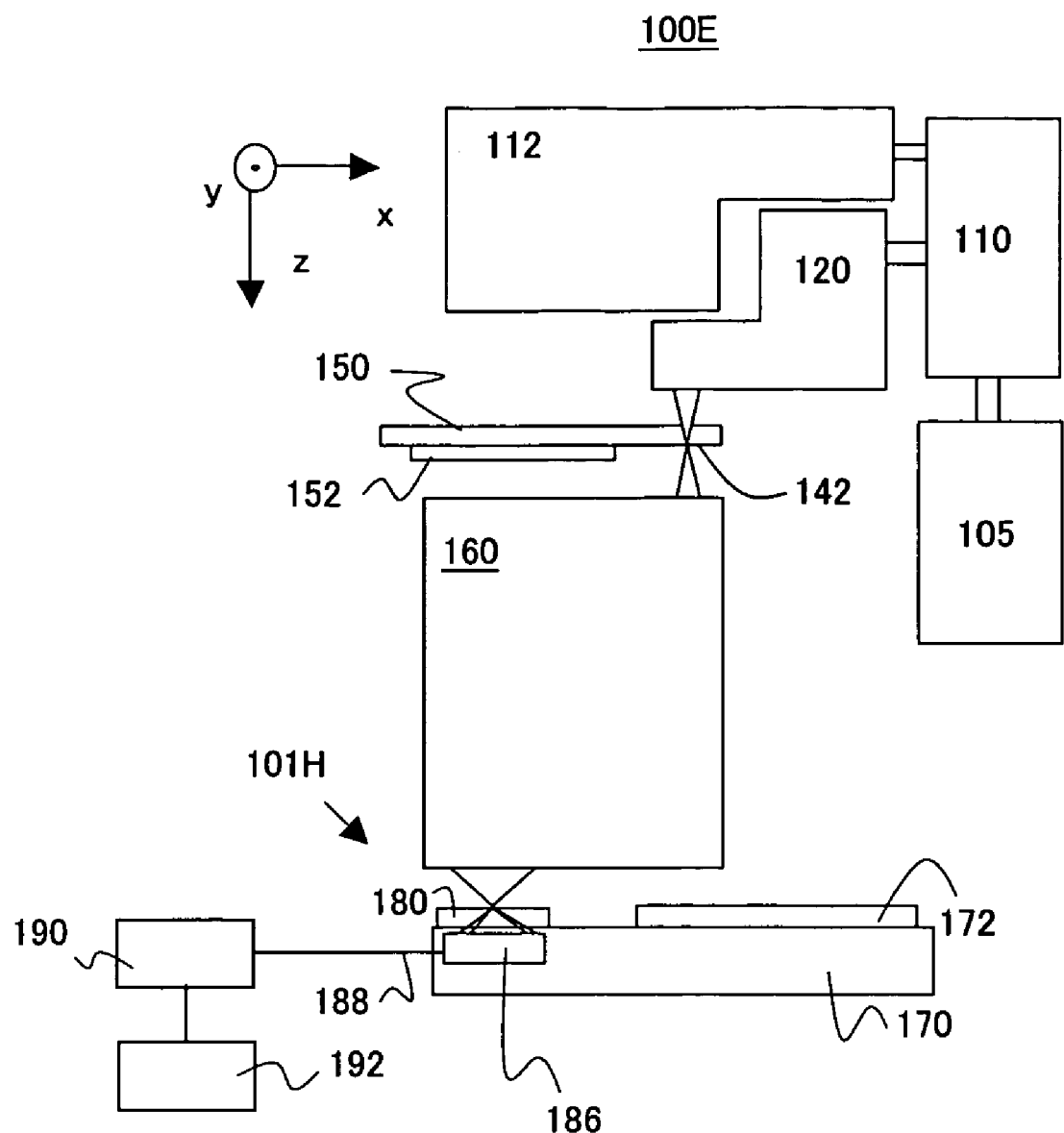
FIG. 19 is a schematic block diagram of an exposure apparatus mounted with a measuring apparatus according to a ninth embodiment of the present invention.

While the instant embodiments have discussed the LDI, the present invention is applicable to the PDI, and a shearing (or Talbo) interferometer, such as an LSI. FIG. 19 shows a schematic block diagram of a measuring apparatus 101H that utilizes the shearing interferometry according to a ninth embodiment of the present invention and an exposure apparatus 100E using the same. This configuration can provide the imaging performance of the projection optical system 160 by obtaining the phase information from the interference fringe using the flowchart shown in FIG. 8. In this case, the step 1002 may be replaced with "measuring of a shearing wave front of the projection optical system 160 in the x direction", and the step 1004 may-be replaced with "measuring of a shearing wave front of the projection optical system 160 in the y direction." The shearing interferometer's operation is well known, and a detailed description thereof will be omitted. This embodiment utilizes the second illumination optical system 120 in which the shearing interferometer serves as an alignment optical system, and simplifies the apparatus structure. On the other hand, the PDI can simultaneously measure the x and y directions using the spherical wave, and thus the steps 1002 to 1006 in the flowchart in FIG. 8 are consolidated into the "measurement of the wave front aberration of the projection optical system 160."

A description will now be given of an aberration correction method according to one embodiment of the present invention. The exposure apparatus 100 allows plural optical elements (not shown) in the projection optical system 160 to move in the optical-axis direction and/or a direction orthogonal to the optical-axis direction. By driving one or more optical elements using a driving system (not shown) for aberrational adjustments based on aberrational information obtained from the instant embodiment, it is possible to correct or optimize one or more aberrations of the projection optical system 160, in particular Zeidel's classification of aberrations. The means for adjusting the aberration of the projection optical system 160 can use various known systems, such as a movable lens, a movable mirror (when the projection optical system is a catadioptric optical system or full-mirror optical system), an inclinable parallel plate, a pressure-controllable space, and a surface correction using an actuator.

In the normal exposure, the light emitted from the light source section 105 is deflected by a deflection optical system 110 to the first illumination optical system 112 or 112A in the exposure apparatuses 100 to 100D. Any one of the second illumination optical systems 120 to 120C is arranged outside the optical path during the normal exposure. The light incident upon the first illumination optical system 112 experiences the beam shaping, incoherent processing, σ adjusting, field adjusting, etc. and, for example, Koehler-illuminates the mask 152. The mask 152 is placed on the mask stage 150, and driven during exposure in the scanning exposure apparatus. The light that passes the mask 152 and reflects the mask pattern is imaged onto the plate 172 fixed onto the stage via the wafer chuck (not shown) by the projection optical system 160 at a projection magnification (such as ¼ and ⅕). The wafer is provided on the wafer stage 170, and driven during the exposure. Since the aberration of the projection optical system 160 is corrected, the plate 172 can receive the high-quality exposure process (or the desired resolution).

Figure 20:
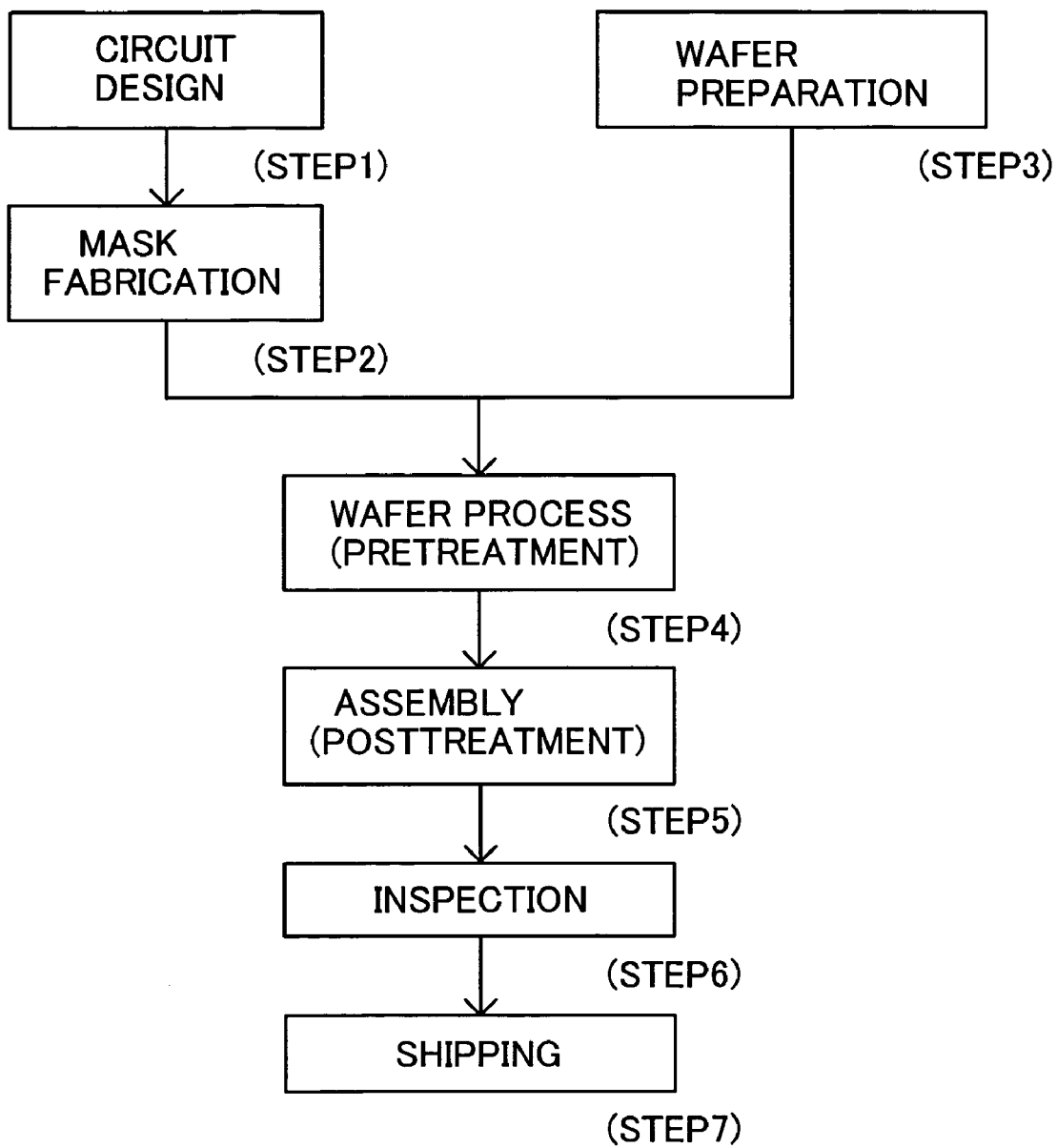
FIG. 20 is a flowchart for explaining a method for fabricating devices (semiconductor chips such as ICs, LSIs, and the like, LCDs, CCDs, etc.).
Figure 21:
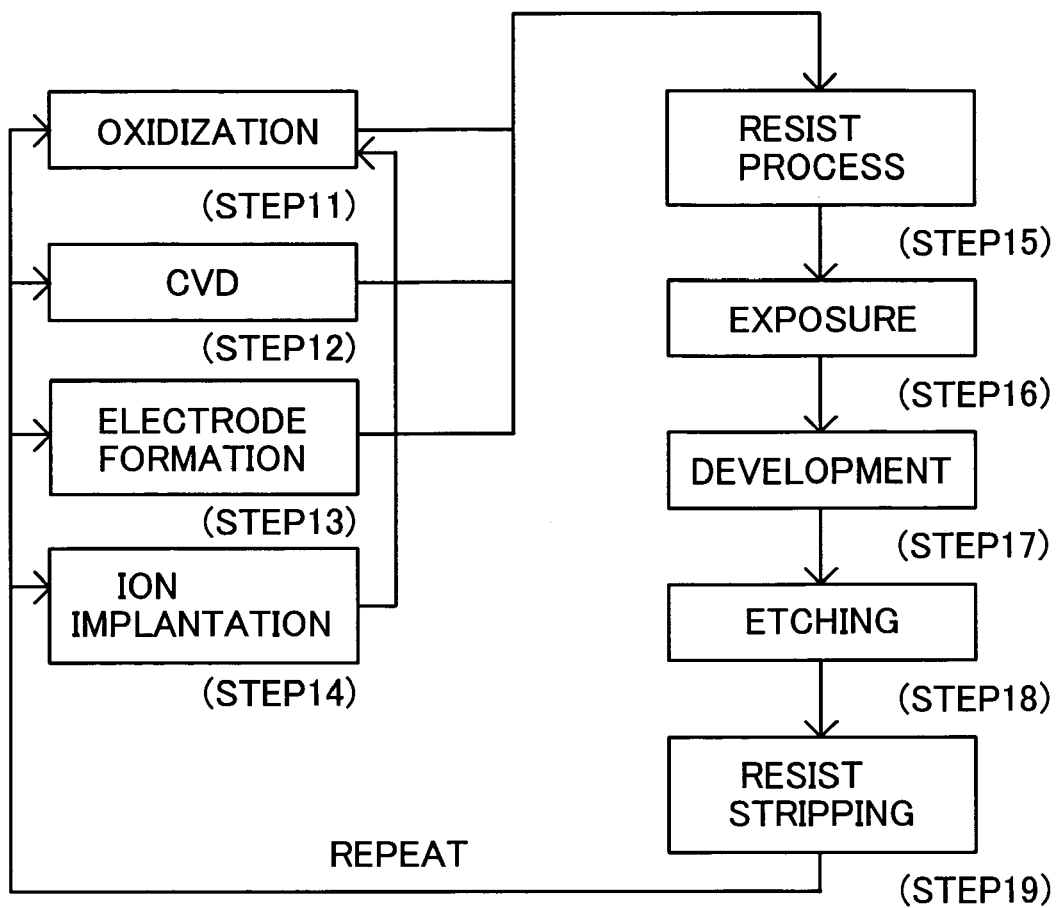
FIG. 21 is a detailed flowchart for Step 4 of wafer process shown in FIG. 20.

Referring now to FIGS. 20 and 21, a description will now be given of an embodiment of a device manufacturing method using the projection exposure apparatus 100, etc. FIG. 20 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 21 is a detailed flowchart of the wafer process in Step 4 shown in FIG. 7 in FIG. 20. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 etc. to expose a mask pattern onto the wafer. Step 17 (development) develops the exposed wafer 47. Step 18 (etching) etches parts other than a developed resist image. Step 19 (resist stripping) removes disused resist after etching. These steps are repeated, and multilayer circuit patterns are formed on the wafer. The manufacturing method of this embodiment can quickly and easily obtain the imaging performance of the projection optical system 160 without lowering the exposure throughput, and utilize the projection optical system 160 whose wave front aberration has been highly precisely corrected. The projection optical system 160 whose wave front aberration has been highly precisely corrected can provide an alignment for the wafer stage with high precision. Therefore, the manufacture semiconductor devices with good productivity and economical efficiency (such as semiconductor devices, LCD devices, image pickup devices (e.g., CCDs), and thin film magnetic heads) which have been difficult to manufacture. Thus, the device manufacturing method that uses the exposure apparatus 100, and its resultant (intermediate and final) products also constitute one aspect of the present invention.

The present invention thus can provide a measuring method and apparatus which utilize the shearing interferometry and provide higher precision and easier signal processing than the conventional method, an exposure method and apparatus using them, and a device manufacturing method.

This application claims a foreign priority based on Japanese Patent Application No. 2004-055358, filed Feb. 27, 2004, which is hereby incorporated by reference herein.

What is claimed is:

1. An exposure apparatus for exposing a pattern of a mask onto an object using light from a light source, said exposure apparatus comprising:
   a projection optical system configured to project the pattern of the mask onto the object; and
   a measuring apparatus configured to measure optical performance of said projection optical system,
   wherein said measuring apparatus is a line diffraction interferometer that uses a transparent substrate,
   wherein said measuring apparatus includes:
      an illumination optical system;
      a second measurement mask having a pair of a 0° orienting slit and a window, and a pair of a 90° orienting slit and a window; and
      an image pickup device,
   wherein the transparent substrate includes:
      a first measurement mask having a pair of a 0° orienting slit and a window, and a pair of a 90° orienting slit and a window; and
      a light splitter for splitting light,
   wherein the light splitter is formed at one side of the transparent substrate and the first measurement mask is formed at the other side of the transparent substrate, so that the light splitter is arranged on the transparent substrate on the side of the illumination optical system and the first measurement mask is arranged on the transparent substrate on the side of said projection optical system,
   wherein said measuring apparatus is arranged such that the split light from the light splitter is directed to the first measurement mask, the light passed by the first measurement mask is imaged on the second measurement mask by said projection optical system, the light that pass the second measurement mask interfere with each other, and the image pickup device observes the interference fringe, and
   wherein the light splitter includes a first diffraction grating that has lines arranged in a 0° direction and a second diffraction grating that has lines arranged in a 90° direction, and is arranged so that lights split by the first diffraction grating is introduced to the pair of the 0° orienting slit and the window in the first measurement mask and so that light split by the second diffraction grating is introduced to the 90° orienting slit and the window in the first measurement mask.

* * * * *